United States Patent
Baek et al.

(10) Patent No.: US 9,576,953 B2
(45) Date of Patent: Feb. 21, 2017

(54) LAYOUT DESIGN SYSTEM, SEMICONDUCTOR DEVICE FABRICATED BY USING THE SYSTEM AND METHOD FOR FABRICATING THE SEMICONDUCTOR DEVICE

(71) Applicant: SAMSUNG ELECTRONICS CO., LTD., Suwon-si, Gyeonggi-do (KR)

(72) Inventors: Kang-Hyun Baek, Yongin-si (KR); Jin-Hyun Noh, Seoul (KR); Tae-Joong Song, Seongnam-si (KR); Gi-Young Yang, Seoul (KR); Sang-Kyu Oh, Gwacheon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/488,628

(22) Filed: Sep. 17, 2014

(65) Prior Publication Data

US 2015/0221644 A1    Aug. 6, 2015

(30) Foreign Application Priority Data

Feb. 3, 2014   (KR) .................. 10-2014-0012160

(51) Int. Cl.
*H01L 27/088* (2006.01)
*H01L 29/417* (2006.01)
*H01L 29/78* (2006.01)
*H01L 27/11* (2006.01)
*G06F 17/50* (2006.01)

(52) U.S. Cl.
CPC ....... *H01L 27/0886* (2013.01); *H01L 27/1104* (2013.01); *H01L 29/7851* (2013.01); *G06F 17/5068* (2013.01)

(58) Field of Classification Search
CPC ................... H01L 27/0886; H01L 29/41775
USPC .......................................... 257/401
See application file for complete search history.

(56) References Cited

U.S. PATENT DOCUMENTS

| | | | |
|---|---|---|---|
| 6,674,134 B2 | 1/2004 | Berry et al. | |
| 7,098,502 B2 | 8/2006 | Mathew et al. | |
| 7,279,375 B2 | 10/2007 | Radosavljevic et al. | |
| 7,923,337 B2 | 4/2011 | Chang et al. | |

(Continued)

FOREIGN PATENT DOCUMENTS

| | | |
|---|---|---|
| JP | 2006-253198 A | 9/2006 |
| JP | 4536186 B2 | 9/2010 |
| KR | 10-2007-0069913 | 7/2007 |

*Primary Examiner* — Moazzam Hossain
(74) *Attorney, Agent, or Firm* — Volentine & Whitt, PLLC

(57) ABSTRACT

A layout design system for designing a semiconductor device includes a processor, a storage module storing an intermediate design, and a correction module used by the processor to correct the intermediate design. The intermediate design includes an active region and dummy designs on the active region. Each dummy design includes a dummy structure and dummy spacers disposed at opposite sides of the dummy structure. The correction module is configured to alter widths of regions of at least some of the dummy designs. The corrected design is used to produce a semiconductor device having an active fin, a hard mask layer disposed on the active fin, a gate structure crossing the over the hard mask layer, and a spacer disposed on at least one side of the gate structure. The hard mask layer, and the active fin, are provided with widths that vary due to the dummy designs.

16 Claims, 58 Drawing Sheets

(56) References Cited

U.S. PATENT DOCUMENTS

| | | | |
|---|---|---|---|
| 8,062,963 B1 | 11/2011 | Van Dal | |
| 8,466,012 B1* | 6/2013 | Chang | H01L 21/823821 |
| | | | 257/347 |
| 2005/0051812 A1* | 3/2005 | Dixit | H01L 29/1041 |
| | | | 257/250 |
| 2006/0014338 A1* | 1/2006 | Doris | H01L 29/41733 |
| | | | 438/197 |
| 2006/0177977 A1* | 8/2006 | Chan | H01L 21/0337 |
| | | | 438/238 |
| 2007/0148599 A1* | 6/2007 | True | G01N 33/532 |
| | | | 430/311 |
| 2009/0108360 A1* | 4/2009 | Smayling | H01L 21/28518 |
| | | | 257/368 |
| 2010/0155853 A1* | 6/2010 | Yoon | G11C 7/1012 |
| | | | 257/390 |
| 2010/0181613 A1* | 7/2010 | Kim | H01L 27/10808 |
| | | | 257/329 |
| 2011/0001243 A1* | 1/2011 | Sel | H01L 21/76816 |
| | | | 257/773 |
| 2011/0159686 A1* | 6/2011 | Jung | G03F 7/0035 |
| | | | 438/671 |
| 2013/0045580 A1* | 2/2013 | Cho | H01L 21/823431 |
| | | | 438/296 |
| 2013/0200395 A1 | 8/2013 | Liaw et al. | |
| 2013/0328162 A1* | 12/2013 | Hu | H01L 27/0629 |
| | | | 257/526 |
| 2014/0203369 A1* | 7/2014 | Fumitake | H01L 29/785 |
| | | | 257/365 |
| 2014/0367780 A1* | 12/2014 | Hong | H01L 29/785 |
| | | | 257/347 |

* cited by examiner

FIG. 10
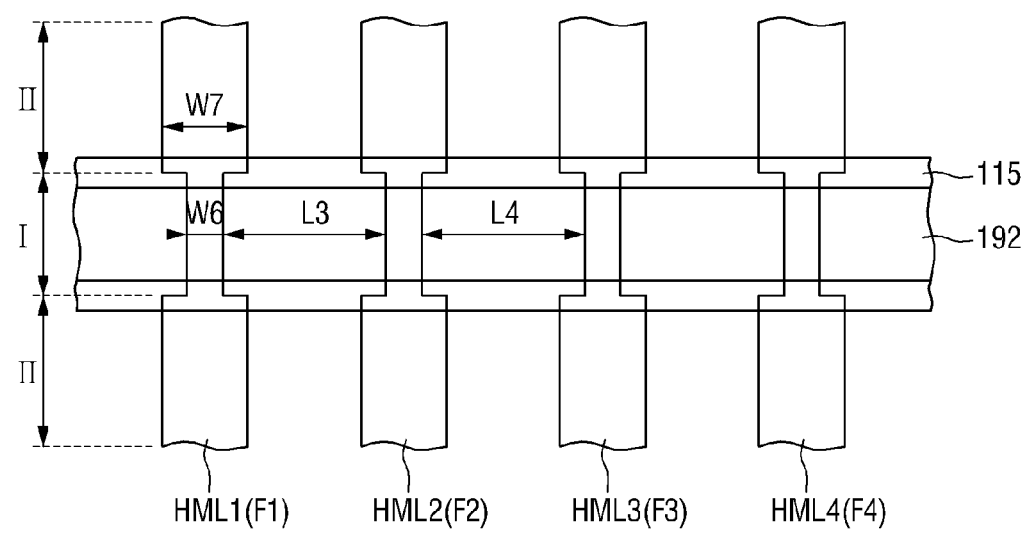
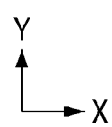

<u>8</u>

1200

1300

1400

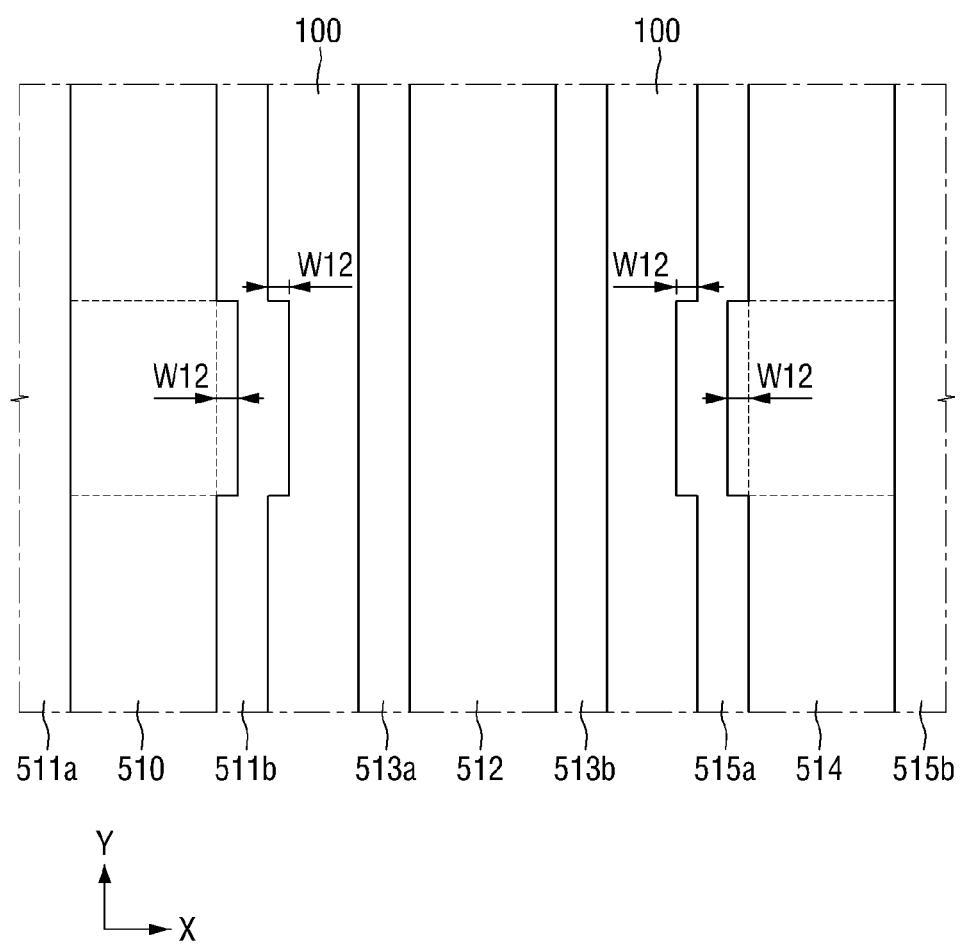

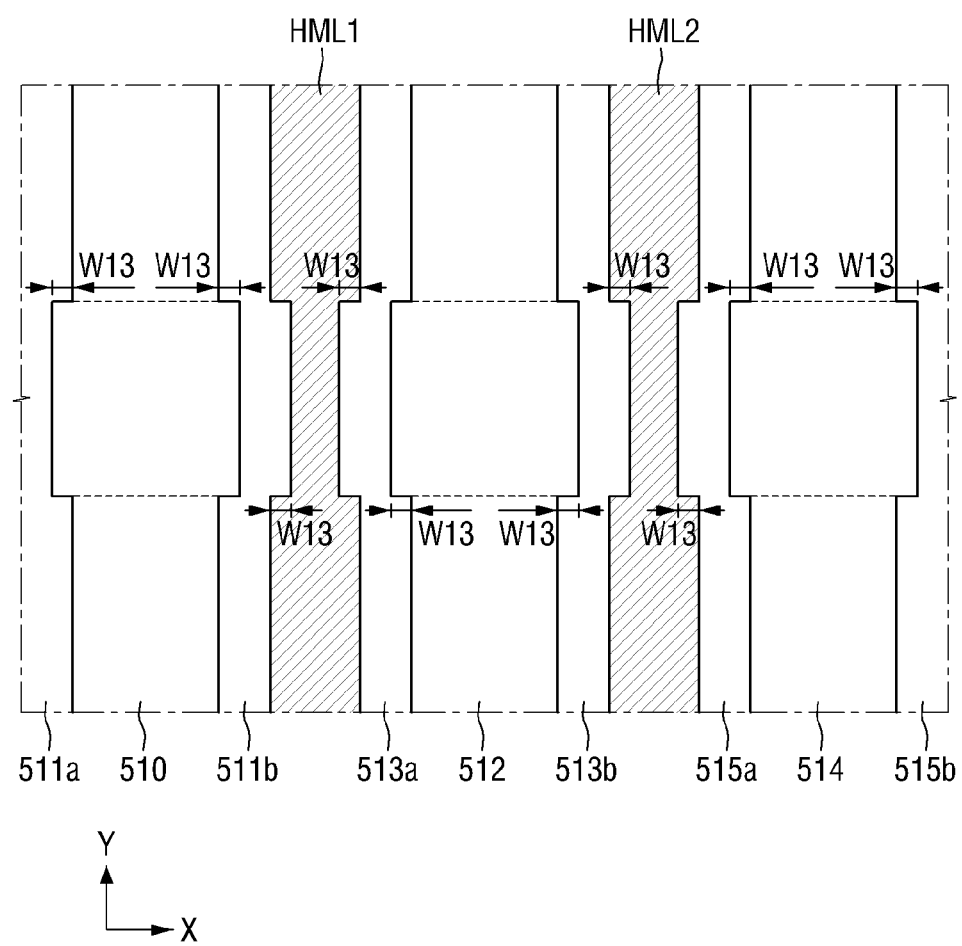

FIG. 29A
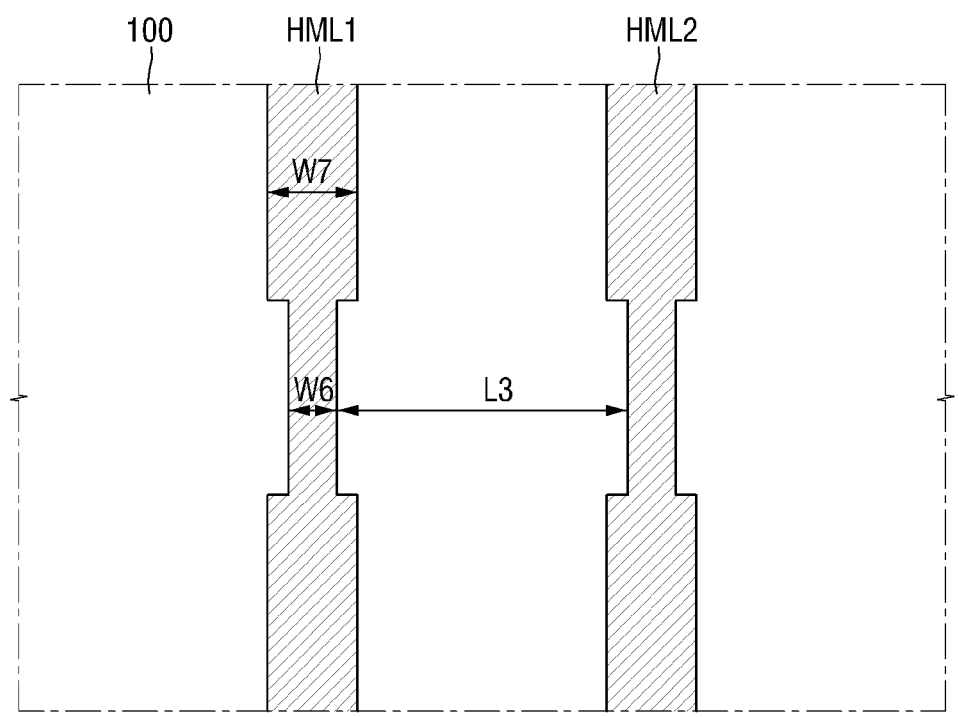
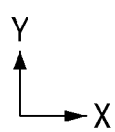

LAYOUT DESIGN SYSTEM, SEMICONDUCTOR DEVICE FABRICATED BY USING THE SYSTEM AND METHOD FOR FABRICATING THE SEMICONDUCTOR DEVICE

PRIORITY STATEMENT

This application claims priority from Korean Patent Application No. 10-2014-0012160 filed on Feb. 3, 2014 in the Korean Intellectual Property Office, and all the benefits accruing therefrom under 35 U.S.C. 119, and the contents of which are hereby incorporated by reference in their entirety.

BACKGROUND

1. Field of the Invention

The present inventive concept relates to semiconductor devices. In particular, the present inventive concept relates to finFETs, a layout design system for designing finFETs, and to methods of fabricating finFETs.

2. Description of the Related Art

In recent years, advances in semiconductor device technology are producing devices that operate at lower voltages and higher speeds. At the same time, there are demands for semiconductor devices that have higher integration densities.

However, increasing the integration density of semiconductor devices constituted by field effect transistors (FET) may lead to short channel effects in the transistors. In order to overcome the problem, i.e., to provide FETs that have high degrees of integration and yet whose gates are effective when supplied with relatively low amounts of power and which can nonetheless operate at high speeds, various research has been conducted in developing transistors that have three-dimensional (3D) channels. One such class of transistors are finFETs.

SUMMARY

According to an aspect of the inventive concept, there is provided a layout design system comprising: a processor; a storage module in which an intermediate design is stored, wherein the intermediate design includes an active region and a plurality of dummy designs disposed on the active region, each of the dummy designs includes a dummy structure and dummy spacers disposed at opposite sides of the dummy structure; and a correction module configured to alter widths of regions of at least some of the dummy designs.

According to still another aspect, there is provided a semiconductor device comprising: an active fin extending longitudinally in a first direction, a hard mask layer disposed on the active fin and having a bottom surface substantially matching the top surface of the active fin, a gate structure extending longitudinally, in a second direction crossing the first direction, on the hard mask layer, and a spacer disposed on at least one side of the gate structure, and in which the hard mask layer occupies a first region and a second region adjacent to the first region in the first direction, and a width of the hard mask layer in the first region is different from a width of the hard mask layer in the second region as taken in the second direction.

According to still another aspect, there is provided a finFET structure comprising: a plurality of active fins each extending longitudinally in a first direction, and hard masks disposed on and aligned with upper surfaces of the fins, respectively, and in which the active fins are spaced in a second direction perpendicular to the first direction, each of the active fins have a width in the second that varies and the hard masks also each have a width in the second direction that varies.

BRIEF DESCRIPTION OF THE DRAWINGS

The above and other features and advantages of the present inventive concept will become more apparent by describing More specifically preferred embodiments thereof with reference to the attached drawings in which:

FIG. 10 is a layout view of a second embodiment of a semiconductor device according to the present inventive concept;

FIGS. 22B, 23A, 23B, 24A, 24B, 24C, 25A and 25B illustrate a first embodiment of a method of fabricating a semiconductor device according to the present inventive concept;

FIGS. 26, 27A, 27B, 28A, 28B, 28C, 29A and 29B illustrate a second embodiment of a method of fabricating a semiconductor device according to the present inventive concept;

DETAILED DESCRIPTION OF THE PREFERRED EMBODIMENTS

Figure 1:
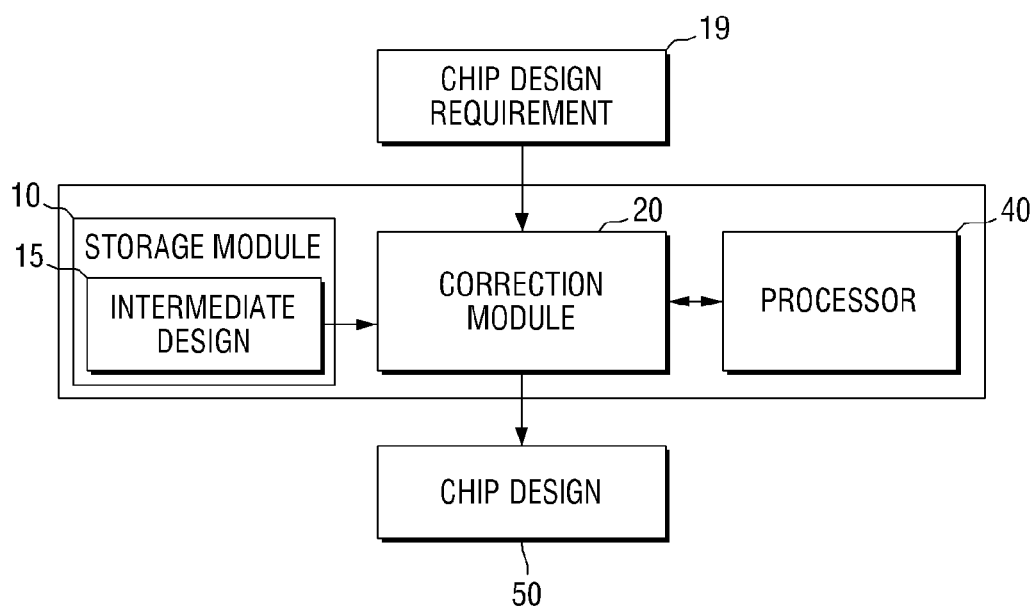
FIG. 1 is a block diagram of a layout design system according to the present inventive concept.

Advantages and features of the present inventive concept and methods of accomplishing the same may be understood more readily by reference to the following detailed description of preferred embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the present inventive concept will only be defined by the appended claims. Like reference numerals designate like elements throughout the drawings.

It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section.

Spatially relative terms, such as "beneath", "below", "lower", "above", "upper", and the like, may be used herein for ease of description to describe one element or feature's relationship to another element(s) or feature(s) as illustrated in the figures. Obviously, though, all such spatially relative terms refer to the orientation shown in the drawings for ease of description and are not necessarily limiting as embodiments according to the inventive concept can assume orientations different than those illustrated in the drawings when in use.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, an embodiment of a layout design system according to the present inventive concept will be described with reference to FIG. 1.

The layout design system 1 includes a storage module 10, a correction module 20, and a processor 40. The term "unit" or "module", as used herein, may refer to a software or hardware component, such as a field programmable gate array (FPGA) or an application specific integrated circuit (ASIC), which performs certain tasks. A unit or module may advantageously reside in an addressable storage medium and be configured to execute on command from one or more processors. Thus, a unit or module may include a component configured with software such as object-oriented software or firmware, a class component, a task component or a driver. A unit or module may be that part of a component configured to carry out a particular process or subroutine or serve a particular function. Thus, a unit or module may comprise one or more segments of program code, microcode, circuitry, data, databases, data structures, tables, arrays, and may be configured with algorithms containing variables. And, although FIG. 1 shows an embodiment of the layout design system having certain individual units or modules, the system is not so limited. Rather, other embodiments according to the inventive concept may contain fewer units or modules which combine the functions associated with the units or modules of FIG. 1 described below, or additional units or modules to separate out or expand the functions.

Referring again to FIG. 1, the storage module 10 stores data of an intermediate design 15 described in more detail later on, and provides the data of the stored intermediate design 15 to the correction module 20. Also, although FIG. 1 illustrates data of one intermediate design 15 stored in the storage module 10, data of a plurality of intermediate designs 15 may be stored in the storage module 10 in the form of a library.

The storage module 10 comprises, for example, a non-volatile memory device. The non-volatile memory device may include a NAND flash, NOR flash, MRAM, PRAM, RRAM, or the like. Furthermore, the storage module 10 may be embodied as a data storage device having a magnetic memory medium, e.g., a hard disk drive, or the like.

The correction module 20 corrects the intermediate design 15 using the processor 40 according to a chip design requirement 19. More specifically, the correction module 20 may generate markers for correcting widths of respective ones of dummy regions of the intermediate design 15.

In an example of this embodiment, the correction module 20 is implemented in the form of software. In this case, the correction module 20 may be stored in the storage module 10. However, the correction module 20 may be stored in another storage module (not shown) distinct from the storage module 10. Furthermore, the correction module 20 may be embodied in a form other than software.

The processor 40 operates the correction module 20, i.e., may issue a command that allows the correction module to perform its operation. Although FIG. 1 shows the processor 40 as one component of the layout design system 1, the processor may employ a plurality of computing components. For example, the processor 40 may be a multi-core processor. Also, and although not shown, the processor 40 may further include a cache memory, such as a multi-level cache.

FIG. 1 illustrates an example in which the layout design system 1 adjusts the intermediate design 15 using the correction module 20 according to the chip design requirement 19 to generate data of a chip design 50, but the present inventive concept is not limited thereto. Rather, for example, the layout design system 1 may use a block design requirement (not shown) instead of the chip design requirement to configure the correction module 20 (or control the mode of operation thereof) in such a way that the correction module 20 generates from the intermediate design 15 data of a block design (not shown) instead of data of a chip design.

The intermediate design 15 and the operation of correction module 20 will now be described in more detail with reference to FIGS. 2-4.

Figure 2:
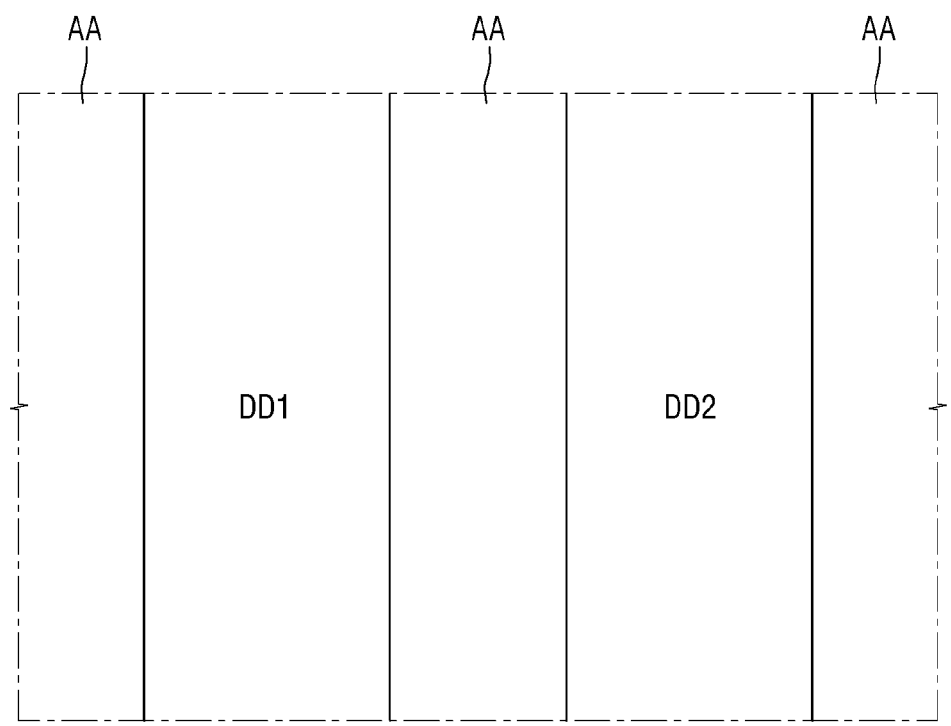
FIG. 2 is a schematic layout view of an intermediate design created by the system shown in FIG. 1.

Referring first to FIG. 2, the intermediate design 15 has an active region AA and a plurality of dummy designs DD1 and DD2 (referred to earlier as "dummy regions") disposed on the active region AA as spaced apart from each other. Although only one active region containing dummy designs is shown, the intermediate design 15 may have a plurality of active regions and dummy designs associated therewith.

Figure 3:
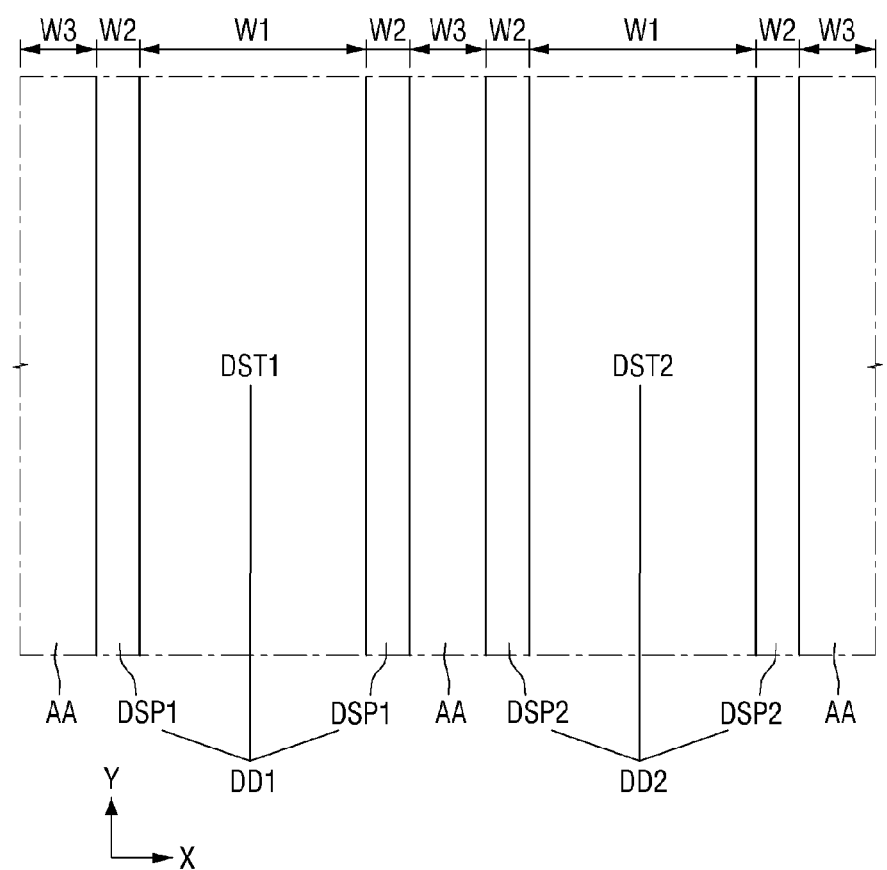
FIG. 3 is a detailed diagram illustrating the intermediate design shown in FIG. 2.

Referring to FIG. 3, the first dummy design DD1 may include a first dummy structure DST1 extending in a first direction Y and a first dummy spacer DSP1 disposed at opposite sides of the first dummy structure DST1, and the second dummy design DD2 may include a second dummy structure DST2 extending in the first direction Y and a second dummy spacer DSP2 disposed at opposite sides of the second dummy structure DST2.

In addition, a width of each of the dummy structures DST1 and DST2 in a second direction X is defined as a first width W1, a width of each of the dummy spacers DSP1 and DSP2 in the second direction X is defined as a second width W2, and a distance between the first and second dummy spacers DSP1 and DSP2 is defined as a third width W3.

The width of each of the dummy structures DST1 and DST2, the width of each of the dummy spacers DSP1 and DSP2 and the distance between the first and second dummy spacers DSP1 and DSP2 may be different from one another. However, for the sake of convenience, an example will be given in which the width of each of the dummy structures DST1 and DST2, i.e., the first width W1, the width of each of the dummy spacers DSP1 and DSP2, i.e., the second width W2, and the distance between the first and second dummy spacers DSP1 and DSP2, i.e., the third width W3, are the same.

Figure 4:
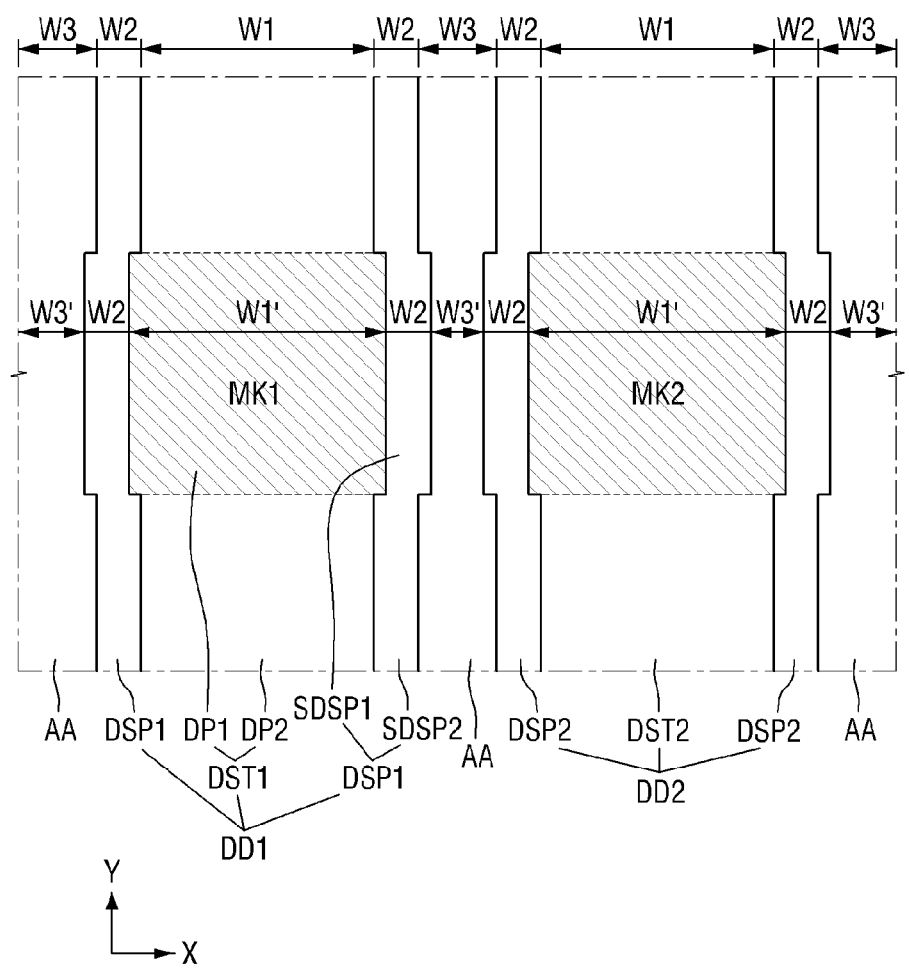
FIG. 4 illustrates the operation of a correction module shown in FIG. 1.

Referring to FIGS. 3 and 4, markers (e.g., MK1 and MK2 shown in FIG. 4) are produced in the dummy designs DD1 and DD2, respectively, using the correction module 20.

More specifically with reference to FIGS. 1 and 4, the correction module 20 may generate the first marker MK1 and the second marker MK2 adjusting the first width W1 of part of each of the first dummy structure DST1 and the second dummy structure DST2. For example, the first marker MK1 adjusts the width of a first dummy part DP1 of the first dummy structure DST1 in the second direction X. In this example, the first dummy structure DST1 includes the first dummy part DP1 and a second dummy part DP2 adjacent to the first dummy part DP1 in the first direction Y.

Also, in this example, the first dummy spacer DSP1 includes a first sub dummy spacer SDSP1 adjacent to the first dummy part DP1 in the second direction X, and a second sub dummy spacer SDSP2 adjacent to the second dummy part DP2 in the second direction X and adjacent to the first sub dummy spacer SDSP1 in the first direction Y.

As shown in the example of FIG. 4, the width of the first sub dummy spacer SDSP1 in the second direction X is the same as the width of the second sub dummy spacer SDSP2 in the second direction X, because the first dummy spacer DSP1 has a uniform width along the outer periphery of the first dummy structure DST1.

Also, in the example shown in FIG. 4, the width W1' of the first dummy part DP1 in the second direction X is greater than the first width W1, and a third width W3' of the exposed active region AA is smaller than the third width W3, but the present inventive concept is not so limited.

The procedure described with reference to FIGS. 1 to 4 produces the chip design 50, namely data for use in fabricating a semiconductor device having an active fin. In particular, the chip design 50 includes data for establishing the width of a hard mask layer for use in forming an active fin on an active region corresponding to the exposed active region AA shown in FIG. 4, which process will be described in more detail later on.

Hereinafter, an embodiment of a semiconductor 2 device fabricated according to the present inventive concept will be described with reference to FIGS. 5 to 9.

The semiconductor device 2 is a fin type transistor (FinFET) but the inventive concept can also be applied to other types of semiconductor devices having 3-dimensional structures (e.g., a transistor comprising a nanowire instead of a fin).

Referring to FIGS. 5 to 9, the semiconductor device 2 may include active fins F1 to F4, hard mask layers HML1 to HML4 directly on the active fins F1 to F4, a gate structure 192, source/drain 161, and a spacer 115. In an alternative embodiment, the hard mask layers HML1 to HML4 are omitted in the final device (having been removed during the fabrication process), and the gate structure 192 and the spacer 115 are disposed directly on the active fins F1 to F4.

Figure 5:
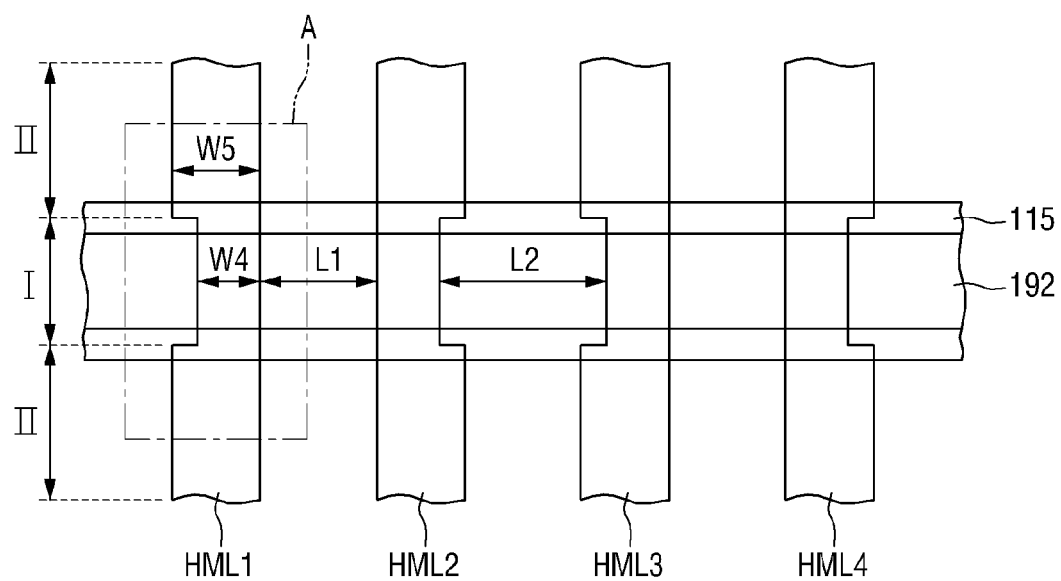
FIG. 5 is a partial layout view of a first embodiment of a semiconductor device according to the present inventive concept.
Figure 6:
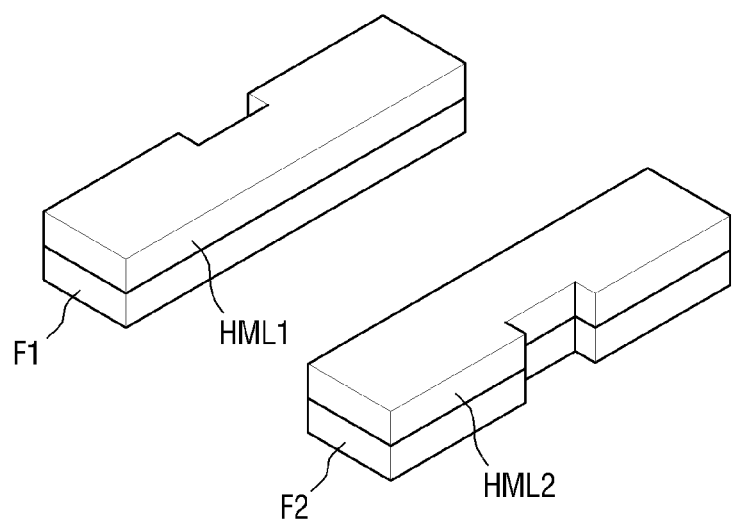
FIG. 6 is a perspective view illustrating some active fins and a hard mask layer shown in FIG. 5.

In any case, the active fins F1 to F4 are formed by an etching process using the hard mask layers HML1 to HML4 as etch masks, as shown in FIGS. 5 and 6. Thus, the (side surfaces of the) active fins F1 to F4 are substantially aligned (and contiguous) with (side surfaces of) the hard mask layers HML1 to HML4. In particular, bottom surfaces of the hard mask layers HML1 to HML4 may be substantially flush with top surfaces of the active fins F1 to F4. Here, the phrase 'substantially' refers to exactly or but for slight differences as the result of processing errors inherent in the fabrication process.

The active fins F1 to F4 protrude from an active layer 100 in a third direction Z. The active fins F1 to F4 may be formed by etching a portion of the active layer 100, or by some other process including that in which the active fins F1 to F4 are formed on the active layer 100.

The active layer 100 may be a semiconductor substrate. When the active layer 100 is a semiconductor substrate, the semiconductor substrate may include one or more semiconductor materials selected from the group consisting of, for example, Si, Ge, SiGe, GaP, GaAs, SiC, SiGeC, InAs and InP.

Alternatively, the active layer 100 may be an epitaxial layer made of a semiconductor material. Here, the epitaxial layer may be formed on an insulating substrate. For example, the active layer 100 may be constituted by a silicon on insulator (SOI) substrate. When an SOI substrate is provided to form the active layer 100, the semiconductor device 2 advantageously operates with a relatively short delay.

The active fins F1 to F4 extend longitudinally in the first direction Y, and are spaced apart from each other in the second direction X.

In the illustrated embodiment, each of the active fins F1 to F4 includes a first region I and a second region II. Here, as shown, the second region II is disposed adjacent to the first region I in the first direction Y.

In the illustrated embodiment, a width W4 of the first region I in the second direction X and a width W5 of the second region II in the second direction X are different from each other. More specifically, the width W4 of the first region I in the second direction X is smaller than the width W5 of the second region II in the second direction X.

Meanwhile, in the illustrated embodiment, the first region I is asymmetrical with respect to the center line of each of the active fins F1 to F4. In other words, a distance from the center line of each of the active fins F1 to F4 to one side of the first region I and a distance from the center line of each of the active fins F1 to F4 to the other side of the first region I are different from each other.

In addition, in the illustrated embodiment, the active fins F1 to F4 are provided in groups of twos because active fins are formed at the sides of each dummy structure (e.g., 512 of FIGS. 24A-24C) referred to hereinafter as a "mandrel", as will later be described in more detail later on.

Therefore, in the illustrated embodiment, a first distance L1 between the first region I of the first active fin F1 and the first region I of the second active fin F2 is different from a second distance L2 between the first region I of the second active fin F2 and the first region I of the third active fin F3. More specifically, in the illustrated embodiment, the first distance L1 is smaller than the second distance L2.

The hard mask layers HML1 to HML4 may extend in the first direction Y on the active fins F1 to F4 so as to overlie the active fins F1 to F4 while not making contact with the active layer 100.

The hard mask layers HML1 to HML4 establish the widths of the active fins F1 to F4 in the second direction X and may be formed in a self-aligned manner. The hard mask layers HML1 to HML4 may include an insulating material, but are not limited to including such a material.

Figure 8:
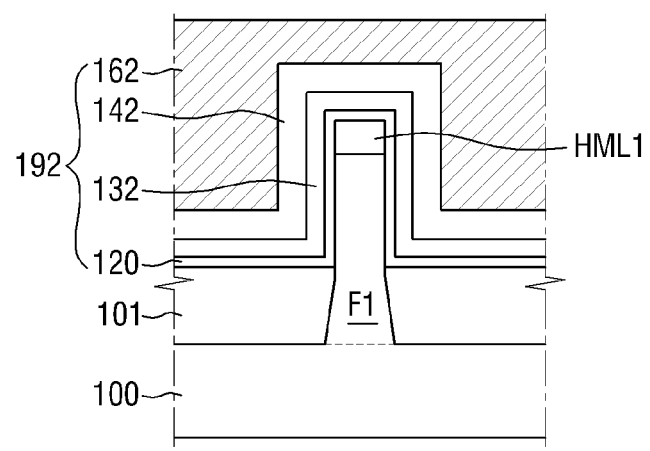
FIG. 8 is a cross-sectional view taken along line B-B of FIG. 7.

An isolation layer 101 may cover side surfaces of the active fins F1 to F4. More specifically, as shown in FIG. 8, the isolation layer 101 may cover lower portions of the active fins F1 to F4. The isolation layer 101 may be an insulating layer of, for example, silicon oxide ($SiO_2$), silicon nitride (SiN), or silicon oxynitride (SiON).

Figure 7:
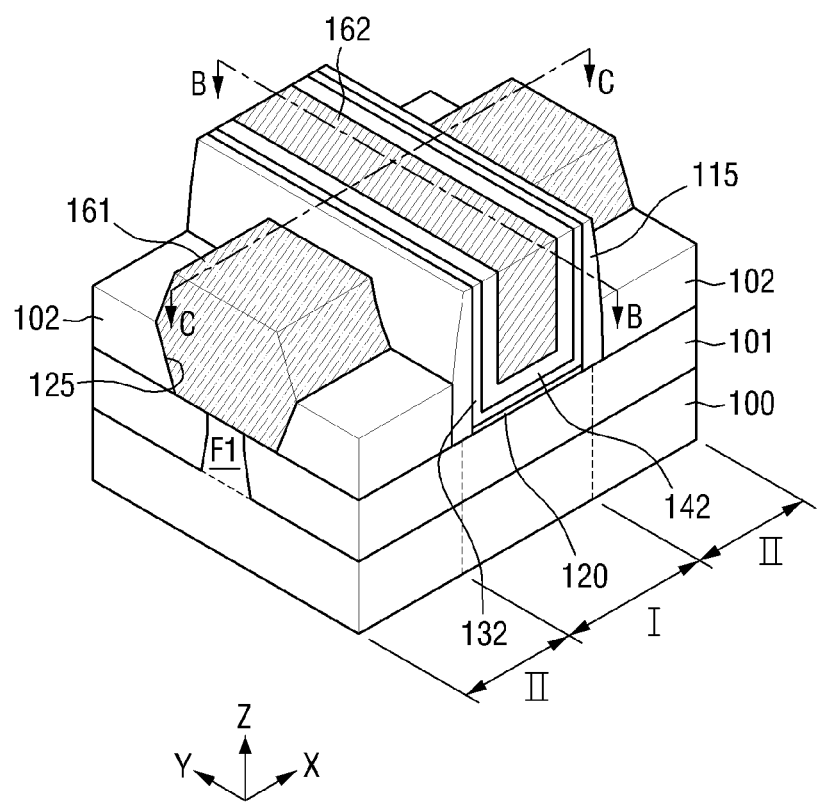
FIG. 7 is a perspective view illustrating a region 'A' shown in FIG. 5.

An interlayer dielectric layer 102 may be disposed in the isolation layer 101. For ease of understanding of the invention, FIG. 7 illustrates only a portion of the interlayer dielectric layer 102 as the interlayer dielectric layer 102 may cover the source/drain 161 and the gate structure 192.

In the illustrated embodiment, the active fins F1 to F4 are tapered such that widths thereof increase downwardly, but the present inventive concept is not limited thereto. For example, the active fins F1 to F4 may have rectangular cross sections. In addition, the active fins F1 to F4 may have chamfered or rounded corners.

As shown, the gate structure 192 extends in the second direction X across the hard mask layers HML1 to HML4. The spacer 115 is disposed at opposite sides of the gate structure 192. Furthermore, the spacer 115 may extend in the second direction X on the hard mask layers HML1 to HML4.

According to the present inventive concept, the first regions I of the first to fourth active fins F1 to F4 may be disposed under the gate structure 192 and the second regions II of the first to fourth active fins F1 to F4 may be disposed under the spacer 115, as illustrated. In addition, some of the first regions I of the first to fourth active fins F1 to F4 may be disposed under the spacer 115. In other words, boundaries between the first regions I and the second region II of the first to fourth active fins F1 to F4 may be positioned under the spacer 115.

In the illustrated embodiment, transistors are disposed on some of the first and second regions I and II of the first to fourth active fins F1 to F4. Each of the transistors includes the gate structure 192, the spacer 115, and a source/drain 161.

The gate structure 192 may include an interface layer 120, a gate insulation layer 132, a work function control layer 142 and a gate electrode 162 sequentially formed on the active fins F1 to F4 and the hard mask layers HML1 to HML4.

The interface layer 120 may extend in the first direction Y on the isolation layer 101, the active fins F1 to F4 and the hard mask layers HML1 to HML4. The interface layer 120 may include a low-k dielectric material layer having a dielectric constant (k) of 9 or less, for example, a silicon oxide layer (k≈4) or a silicon oxynitride layer (k≈4~8 according to the content of oxygen atoms and nitrogen atoms). Alternatively, the interface layer 120 may include silicate, or a combination of the layers exemplified above.

Figure 9:
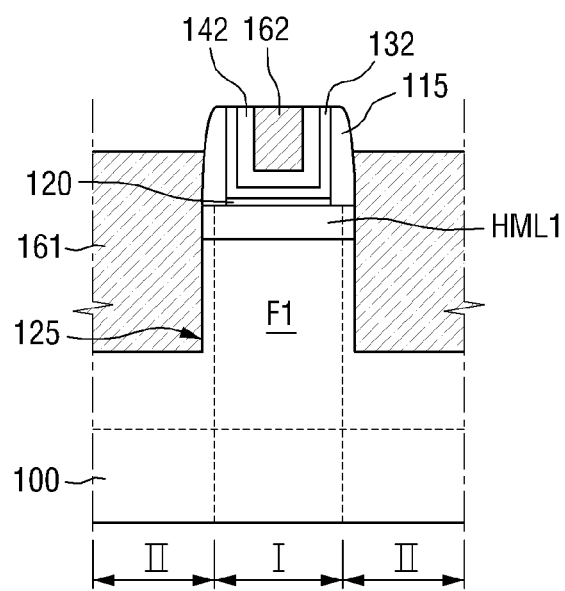
FIG. 9 is a cross-sectional view taken along line C-C of FIG. 7.

The gate insulation layer 132 may be disposed on the interface layer 120. More specifically, the gate insulation layer 132 may extend in the second direction X while covering part of the top of each of the active fins F1 to F4. In addition, as shown in FIG. 9, the gate insulation layer 132 may extend upwardly along sidewalls of the spacer 115 disposed at opposite sides of the gate electrode 162. However, the gate insulation layer 132 may have a shape other than that shown and described. For example, the gate insulation layer 132 may simply extend horizontally on the active fins F1 to F4 and lack the illustrated portions that extend upright along the sidewalls of the spacer 115.

The gate insulation layer 132 may comprise a high-k dielectric material. For example, the gate insulation layer 132 may comprise $HfO_2$, $Al_2O_3$, $ZrO_2$, or $TaO_2$.

The work function control layer 142 may be disposed on the gate insulation layer 132. The work function control layer 142 may extend in the second direction X while partially covering the top portions of the active fins F1 to F4. In addition, like the gate insulation layer 132, the work function control layer 142 may extend upwardly along the sidewalls of the spacer 115. Likewise, the work function control layer 142 may have a shape other than that illustrated.

The work function control layer 142 controls a work function of a transistor. The work function control layer 142 may be at least one of an n-type work function control layer and a p-type work function control layer. When the work function control layer 142 is an n-type work function control layer, it may comprise TiAl, TiAlN, TaC, TaAlN, TiC, or HfSi but these are examples only.

Meanwhile, when the work function control layer 142 is a p-type work function control layer, it may comprise a metal nitride layer. For example, the work function control layer 142 may comprise TiN, TaN or a combination thereof. More specifically, the work function control layer 142 may be consist of a single layer of TiN, or may have a double-layered structure including a TiN lower layer and a TaN upper layer but again, these are examples only.

The gate electrode 162 may be disposed on the work function control layer 142. The gate electrode 162 may extend in the second direction X while partially covering the top portions of the active fins F1 to F4.

The gate electrode 162 may include a material having high conductivity. For example, the gate electrode 162 may comprise a metal. Examples of the metal are W and Al.

A recess 125 exists at opposite sides of the gate structure 192. The sides of the recess 125 are inclined such that the width of the recess 125 increases in a direction away from the active layer 100. As shown in FIG. 7, the width of the recess 125 may be greater than the width of each of the active fins F1 to F4. The recess 125 may be defined by the interlayer dielectric layer 102, and part of the recess may exist within the active fins F1 to F4

The source/drain 161 may be formed in the recess 125. In the illustrated embodiment, the source/drain 161 may be an elevated source/drain. That is, a top surface of the source/drain 161 may be disposed at a level higher than top surfaces of the active fins F1 to F4. In addition, the source/drain 161 and the gate structure 192 may be separated from one another by the spacer 115.

In a case in which a transistor of the above-described elements is a p type transistor, the source/drain 161 may comprise a compressive stress material. The compressive stress material may be a material having a larger lattice constant than silicon (Si), for example, SiGe. The compressive stress material serves to improve the mobility of carriers of a channel region by applying compressive stress to the active fins F1 to F4.

On the other hand, in the case in which the transistor is an n type transistor, the source/drain 161 may include the same material as the active layer 100 or a tensile stress material. For example, when the active layer 100 includes Si, the source/drain 161 may include Si or a material having a smaller lattice constant than Si (e.g., SiC).

In the illustrated embodiment, the recess 125 extends into each of the active fins F1 to F4 and the source/drain 161 is formed in the recess 125, but the present inventive concept is not limited to having this type of source/drain configuration. Rather, the source/drain 161 may be formed in each of the active fins F1 to F4 by directly injecting impurities into the active fins F1 to F4.

In an embodiment of a semiconductor device 2 according to the present inventive concept, transistors spaced from each other in the first direction Y are constituted by portions of the active fins F1 to F4 having different widths (W4 and W5, for example) in the second direction X, respectively. Therefore, the transistors may have the same gate structures but different characteristics.

For example, in the embodiment of FIG. 5, if another gate structure 192 and spacer 115 extends in the second direction X on the second region II of the first to fourth active fins F1 to F4, the resulting transistor in the second region II of the first to fourth active fins F1 to F4 and the transistor shown in the first region I of the first to fourth active fins F1 to F4 have different effective channel widths. Therefore, transistors at the second regions II of the first to fourth active fins F1 to F4 and transistors at the first regions I of the first to fourth active fins F1 to F4 may have different threshold voltages. In addition, the transistors at the second regions II of the first to fourth active fins F1 to F4 and the transistors at the first regions I of the first to fourth active fins F1 to F4 may have different leakage currents.

A second embodiment of a semiconductor device according to the present inventive concept will be described in detail with reference to FIG. 10, with the exception of those features/aspects which are similar to those of the previously described embodiment.

Referring to FIG. 10, each of the first to fourth active fins F1 to F4 (disposed under the hard mask layers HML1 to HML4, respectively) of semiconductor device 3 is symmetrical with respect to the center line of each of the active fins. In other words, a distance from the center line of each of the active fins F1 to F4 to one side of the first region I may be the same as a distance from the center line of each of the active fins F1 to F4 to the other side of the first region I.

As described above, the first region I of each of the active fins F1 to F4 is symmetrical with respect to the center line of the active fin. Therefore, in the illustrated embodiment, a third distance L3 between the first region I of the first active fin F1 and the first region I of the second active fin F2 and a fourth distance L4 between the first region I of the second active fin F2 and the first region I of the third active fin F3 may be equal to each other. In a case in which the distances between each of the active fins F1 to F4 are maintained to be equal to each other, a plurality of transistors having the same characteristics can be advantageously formed using a single gate structure 192.

Meanwhile, in the illustrated embodiment, a width W6 of the first region I of each of the first to fourth active fins F1 to F4 in the second direction X is different from a width W7 of the second region II of each of the first to fourth active fins F1 to F4 in the second direction X. More specifically, the width W6 of the first region I of each of the first to fourth active fins F1 to F4 in the second direction X is smaller than the width W7 of the second region II of each of the first to fourth active fins F1 to F4 in the second direction X. Accordingly, in the illustrated embodiment, transistors having different characteristics from one another may be provided at the regions I and II of different widths W6 and W7 of each of the active fins F1 to F4.

Next, a third embodiment of a semiconductor device according to the present inventive concept will be described with reference to FIGS. 11 and 12, with the exception of aspects/features similar to those of the previously described embodiments.

Figure 11:
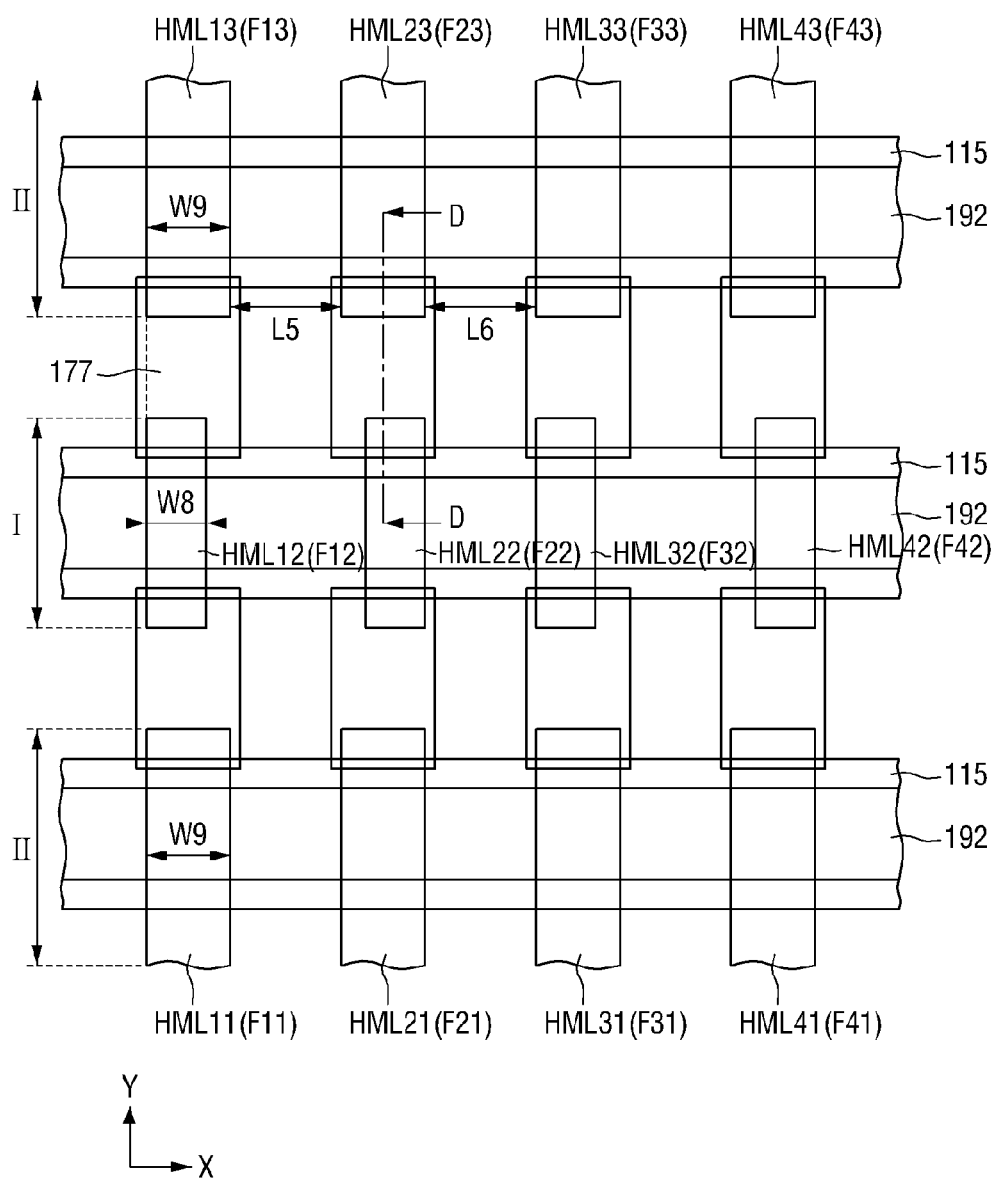
FIG. 11 is a layout view of a third embodiment of a semiconductor device according to the present inventive concept.
Figure 12:
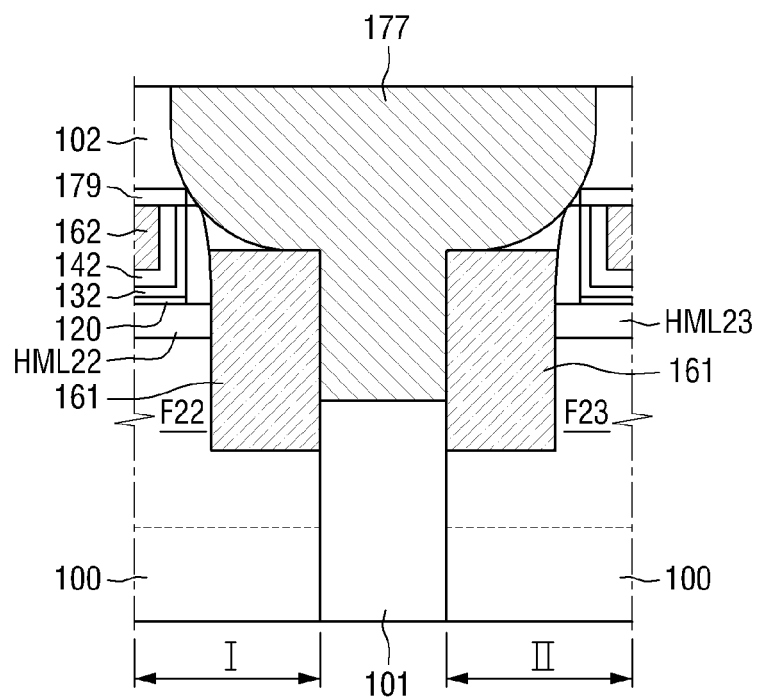
FIG. 12 is a cross-sectional view taken along line D-D of FIG. 11.

Referring to FIG. 11, semiconductor device 4 according to the present inventive concept has active fin segments F11 to F13, F21 to F23, F31 to F33, and F41 to F43 disposed under hard mask layers H11 to H13, H21 to H23, H31 to H33, and H41 to H43, respectively, and in which the segments of respective groups thereof are spaced apart from each other in the first direction Y. In other words, a first active fin may include active fin segments F11 to F13 spaced apart from each other in the first direction Y, a second active fin may include active segments F21 to F23 (FIG. 12) spaced apart from each other in the first direction Y, a third active fin may include active segments F31 to F33 spaced apart from each other in the first direction Y, and a fourth active fin may include active segments F41 to F43 spaced apart from each other in the first direction Y.

Meanwhile, in the illustrated embodiment, a respective self-aligned contact 177 is disposed between the active fin segments F11 to F13, F21 to F23, F31 to F33, and F41 to F43 adjacent to each other in the first direction Y, for electrically connecting respective ones of the active fin segments F11 to F13, F21 to F23, F31 to F33, and F41 to F43 to each other. The self-aligned contact 177 may be formed using a capping layer 179 on the gate electrode 162, but the present inventive concept is not limited thereto.

Another example of this embodiment lacks the self-aligned contacts 177, i.e., the self-aligned contacts 177 are optional.

In the illustrated embodiment, a width W8 of each of the active fin segments F12 to F42 in the second direction X is different from a width W9 of each of the active fin segments F11 to F41 and F13 to F43 in the second direction X. More specifically, the width W8 of each of the active fin segments F12 to F42 may be smaller than the width W9 of each of the active fin segments F11 to F41 and F13 to F43. Accordingly, in the illustrated embodiment, transistors at the active fin segments F12 to F42, i.e., disposed at the first region I, and transistors at the active fin segments F11 to F41 and F13 to F43, i.e., disposed at the second region II, may have different characteristics despite having substantially identical gate structures similarly to an embodiment of FIG. 5.

Moreover, in the illustrated embodiment, one side of each of the active fin segments F12 to F42 disposed in the first region I and one side of each of the active fin segments F11 to F41 and F13 to F43 disposed in the second region II are aligned in the first direction Y. On the other hand, the other side of each of the active fin segments F12 to F42 disposed in the first region I and the other side of each of the active fin segments F11 to F41 and F13 to F43 disposed in the second region II are not be aligned in the first direction Y.

In addition, a distance L5 between the active fin segment F13 disposed in the second region II and a distance L6 between the active fin segment F23 and the fin segment F33 may be equal to each other. Therefore, a plurality of transistors having the same characteristics can be advantageously formed using a single gate structure 192.

Next, a fourth embodiment of a semiconductor device according to of the present inventive concept will be described in detail with reference to FIG. 13, with the exception of aspects/features similar to those of the previously described embodiments.

Figure 13:
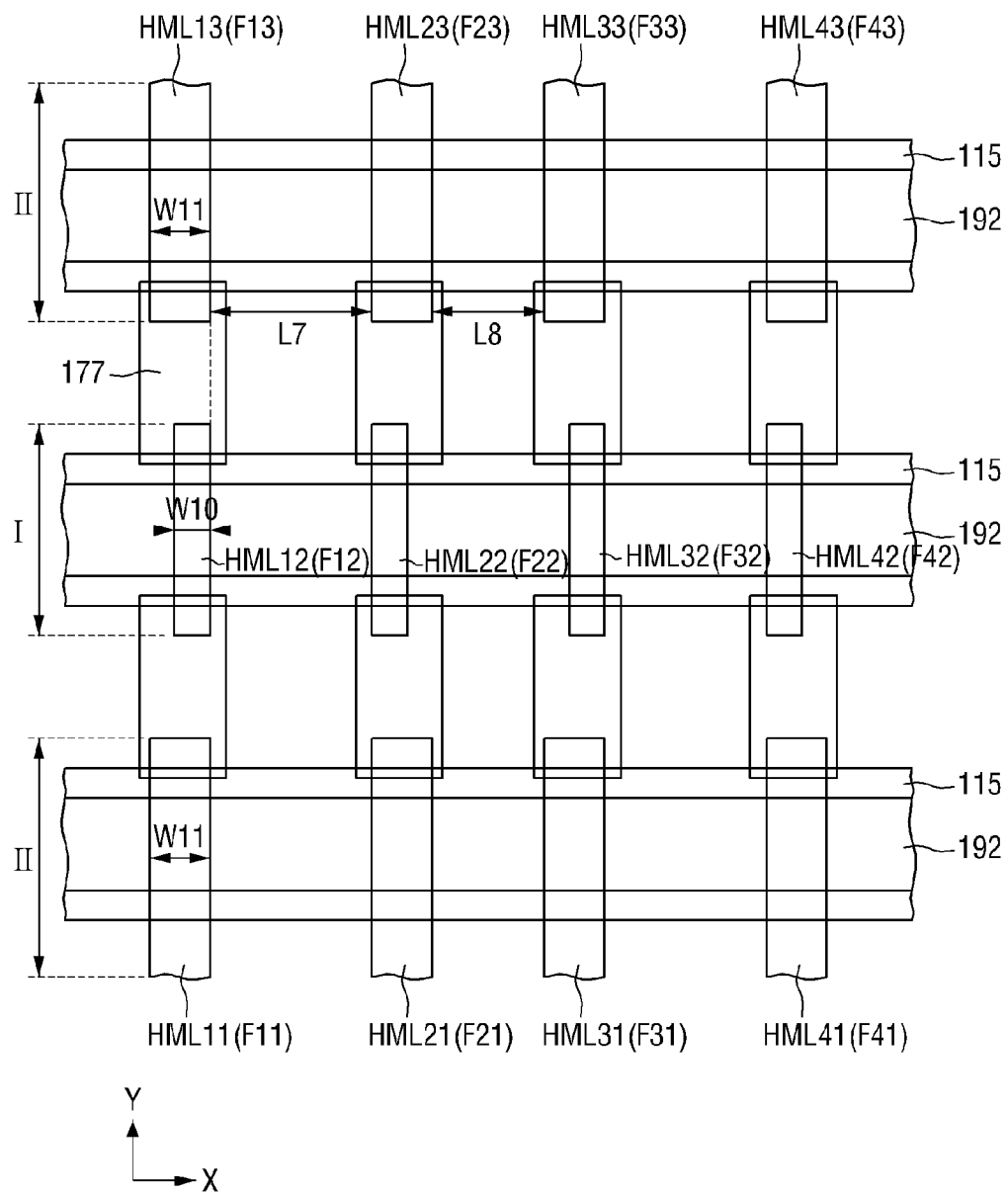
FIG. 13 is a layout view of a fourth embodiment of a semiconductor device according to the present inventive concept.

Referring to FIG. 13, in the embodiment of the semiconductor device 5 according to the present inventive concept, active fin segments F11 to F41 and F13 to F43 in second regions II are asymmetrical with respect to the center line of active fin segments of F12 to F42 (of the same fins) in the first region I.

For example, for each active fin (corresponding to a fin F1-F4 of the first embodiment), one side of its active fin segment F12 to F42 disposed in the first region I and one side of each of its active fin segments F11 to F41 and F13 to F43 disposed in the second regions II are aligned in the first direction Y, and the other side of its active fin segment F12 to F42 disposed in the first region I and the other side of each of its active fin segments F11 to F41 and F13 to F43 disposed in the second regions II are not be aligned in the first direction Y.

Figure 37A:
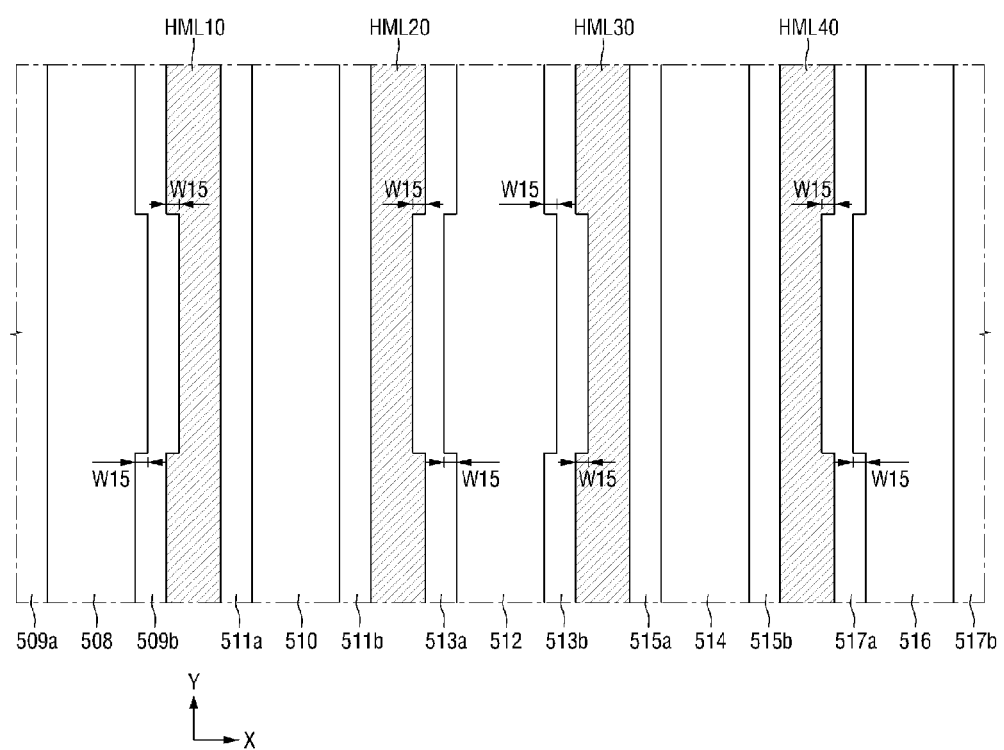
Figure 37B:
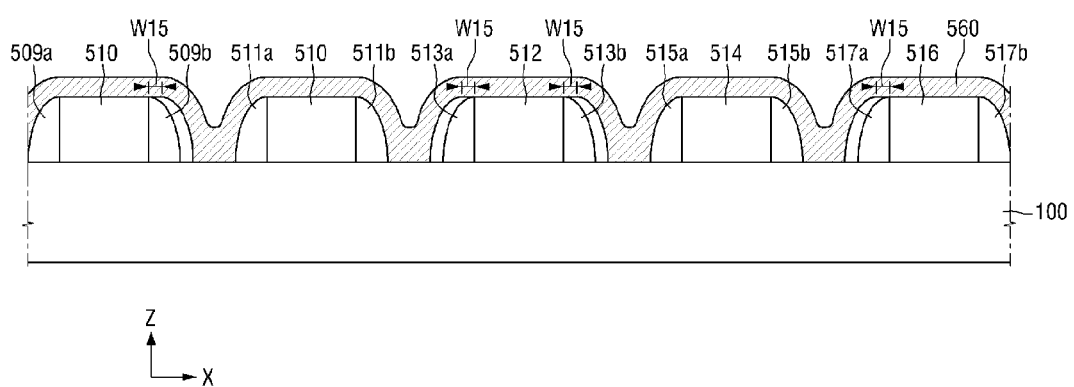
Figure 37C:
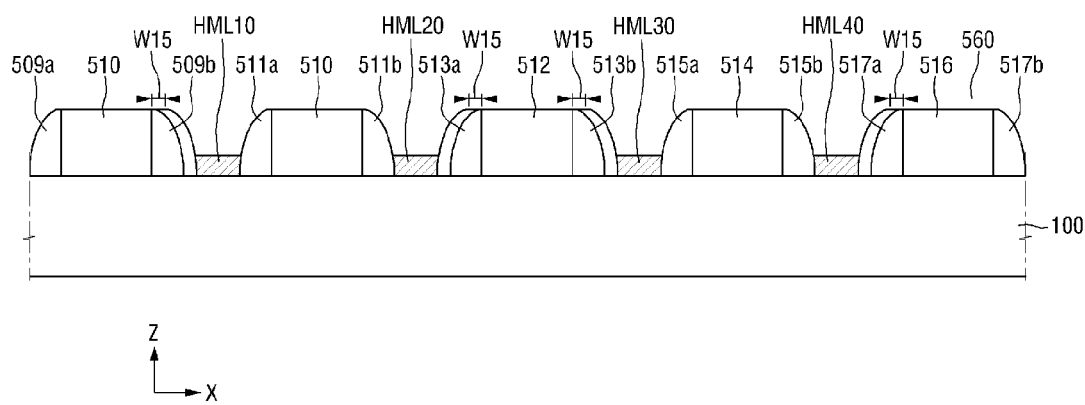

In addition, in the illustrated embodiment, the active fins constituted by the active fin segments F11 to F41, F12 to F42 and F13 to F43 are arranged in groups of two (in the X direction) because the active fins are formed in pairs each through the use of one dummy structure (e.g., 510 of FIGS. 37A-C).

Due to the shapes of the active fin segments F11 to F41, F12 to F42, and F13 to F43, distances between each of the active fin segments F11 to F13, F21 to F23, and F31 to F33 spaced apart from each other in the second direction X may be different from each other. More specifically, a seventh distance L7 between the 13th active fin segment F13 and the 23rd active fin segment F23 disposed in the second region II and an eighth distance L8 between the 23rd active fin segment F23 and the 33rd active fin segment F33 may be different from each other. In particular, the seventh distance L7 may be greater than the eighth distance L8.

Next, a fifth embodiment of a semiconductor device according to the present inventive concept will be described with reference to FIGS. 14 and 15.

Figure 14:
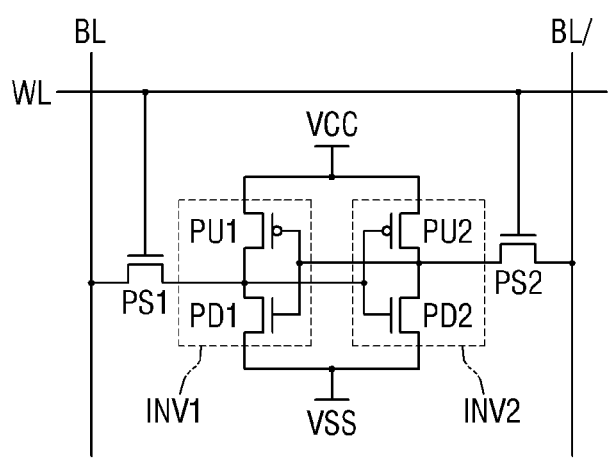
FIG. 14 is a circuit diagram of a fifth embodiment of a semiconductor device according to the present inventive concept.
Figure 15:
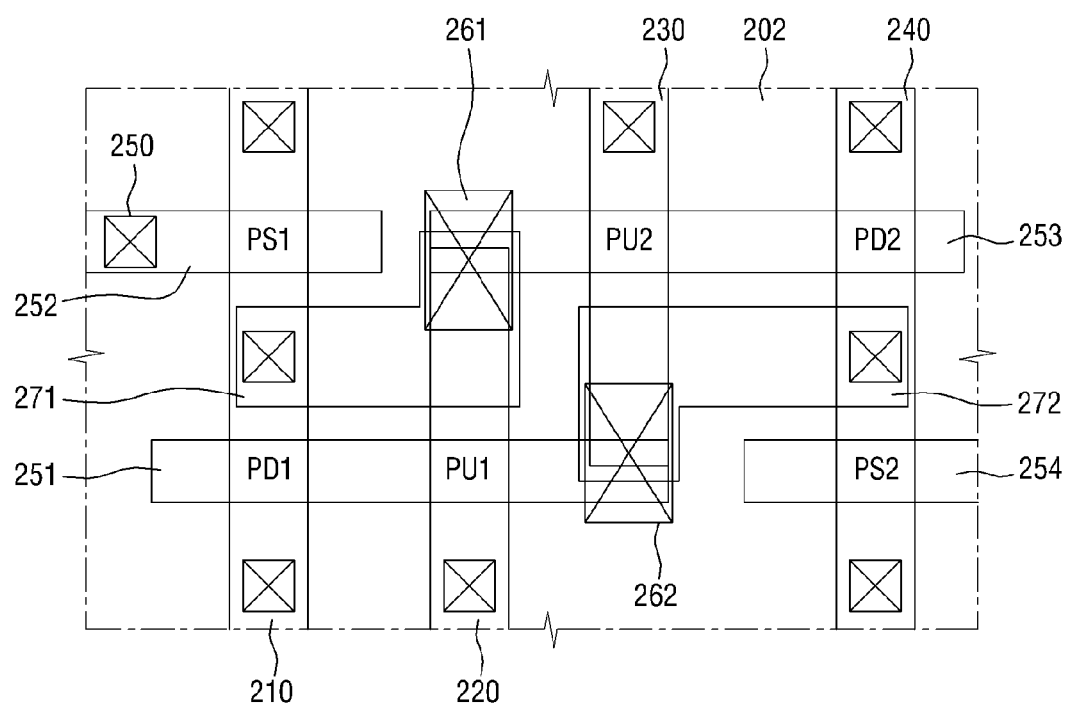
FIG. 15 is a layout view of the semiconductor device shown in FIG. 14.

FIG. 14 is a circuit view of a semiconductor device according to a fifth embodiment of the present inventive concept and FIG. 15 is a layout view of the semiconductor device shown in FIG. 14. The following description will focus on differences between the present and previous embodiments.

Referring to FIGS. 14 and 15, the semiconductor device 6 may include a pair of inverters INV1 and INV2 connected in parallel between a power supply node VCC and a ground node VSS, and a first pass transistor PS1 and a second pass transistor PS2 connected to output nodes of the respective inverters INV1 and INV2. The first pass transistor PS1 and the second pass transistor PS2 may be connected to a bit line BL and a complementary bit line BL/, respectively. Gates of the first pass transistor PS1 and the second pass transistor PS2 may be connected to a word line WL.

The first inverter INV1 may include a first pull-up transistor PU1 and a first pull-down transistor PD1 connected in series to each other, and the second inverter INV2 may include a second pull-up transistor PU2 and a second pull-down transistor PD2 connected in series to each other. The first pull-up transistor PU1 and the second pull-up transistor PU2 may be PFET transistors, and the first pull-down transistor PD1 and the second pull-down transistor PD2 may be NFET transistors.

In addition, in order to constitute a latch circuit, an input node of the first inverter INV1 is connected to an output node of the second inverter INV2 and an input node of the second inverter INV2 is connected to an output node of the first inverter INV1.

Referring to FIGS. 14 and 15, a first active fin 210, a second active fin 220, a third active fin 230 and a fourth active fin 240, which are spaced apart from one another in a first direction (e.g., to the left and right in FIG. 15), may extend lengthwise in a second direction (e.g., top to bottom in FIG. 15). The second active fin 220 and the third active fin 230 may be shorter than the first active fin 210 and the fourth active fin 240.

In addition, a first gate electrode 251, a second gate electrode 252, a third gate electrode 253, and a fourth gate electrode 254 extend lengthwise in the first direction (to the left and right in FIG. 15 in this example) and intersect the active fins 210, 220, 230 and 240. More specifically, the first gate electrode 251 crosses the first active fin 210 and the second active fin 220 while overlapping a terminal (end) of the third active fin 230. The third gate electrode 253 crosses the fourth active fin 240 and the third active fin 230 while overlapping a terminal of the second active fin 220. The second gate electrode 252 and the fourth gate electrode 254 cross the first active fin 210 and the fourth active fin 240, respectively.

As shown in FIGS. 14 and 15, the first pull-up transistor PU1 is defined in the vicinity of the intersection of the first gate electrode 251 and the second active fin 220, the first pull-down transistor PD1 is defined in the vicinity of the intersection of the first gate electrode 251 and the first active fin F1, and the first pass transistor PS1 is defined in the vicinity of the intersection of the second gate electrode 252 and the first active fin 210. The second pull-up transistor PU2 is defined in the vicinity of the intersection of the third gate electrode 253 and the third active fin 230, the second pull-down transistor PD2 is defined in the vicinity of the intersection of the third gate electrode 253 and the fourth active fin 240, and the second pass transistor PS2 is defined in the vicinity of the intersection of the fourth gate electrode 254 and the fourth active fin 240.

Although not shown, sources/drains may be formed at opposite sides of the respective intersections of the first to fourth gate electrodes 251-254 and the first to fourth active fins 210, 220, 230 and 240. In addition, a plurality of contacts 250 for the active fins 210 to 240 may be provided.

A shared contact 261 concurrently connects the second active fin 220, the third gate electrode 253 and an interconnection 271. A shared contact 262 may concurrently connect the third active fin 230, the first gate electrode 251 and an interconnection 272.

Here, the first to fourth gate electrodes 251 to 254 and the first to fourth active fins 210, 220, 230 and 240 may be fabricated using the layout design system 1 according to the present inventive concept.

The semiconductor device 6 may be used as, for example, a static random access memory (SRAM). In addition, one or more of the transistors PU1 to 2, PD1 to 2, and PS1 to 2 of the semiconductor device 6 may be embodied as described previously according to the inventive concept. For example, the first pass transistor PS1 shown in FIG. 15 may be formed on the 13th active fin segment F13 shown in FIG. 13, and the first pull-down transistor PD1 may be formed on the 12th active fin segment F12 shown in FIG. 13. In addition, for example, the second pull-down transistor PD2 shown in FIG. 15 may be formed on the 43rd active fin segment F43 shown in FIG. 13, and the second pass transistor PS2 may be formed on the 42nd active fin segment F42 shown in FIG. 13. On the other hand, for example, the second pull-up transistor PU2 shown in FIG. 15 may be formed on the 33rd active fin segment F33 shown in FIG. 13, and the first pull-up transistor PU1 may be formed on the 22nd active fin segment F22 shown in FIG. 13.

Next, sixth and seventh embodiments of semiconductor devices according to the present inventive concept will be described with reference to FIGS. 16 and 17.

Figure 16:
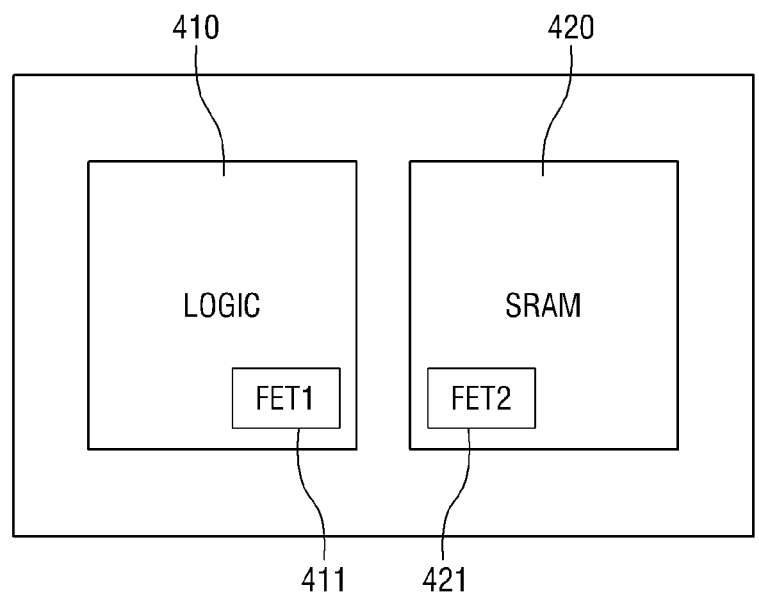
FIG. 16 is a block diagram of a semiconductor device according to the present inventive concept.

First, referring to FIG. 16, a semiconductor device 7 according to the present inventive concept may include a logic region 410 and an SRAM region 420. A first FET-based device 411 may be disposed in the logic region 410 and a second FET-based device 421 may be disposed in the SRAM region 420.

In this embodiment of a semiconductor device 7, the first FET-based device 411 may be embodied as any one of the above-described semiconductor devices 2 to 5 according to the present inventive concept and the second FET-based device 421 may be embodied as the semiconductor device 6 according to the present inventive concept. For example, the first FET-based device 411 may be embodied as the semiconductor device 2 shown in FIG. 5 and the second FET-based device 421 may be embodied as the semiconductor device 6 shown in FIGS. 14 and 15.

Also, in the embodiment of FIG. 16, the memory region 420 is shown and described as be constituted by a SRAM by way of example only. That is, the device 7 may comprise other types of memories (e.g., a DRAM, MRAM, RRAM, or PRAM) in the memory region 420.

Figure 17:
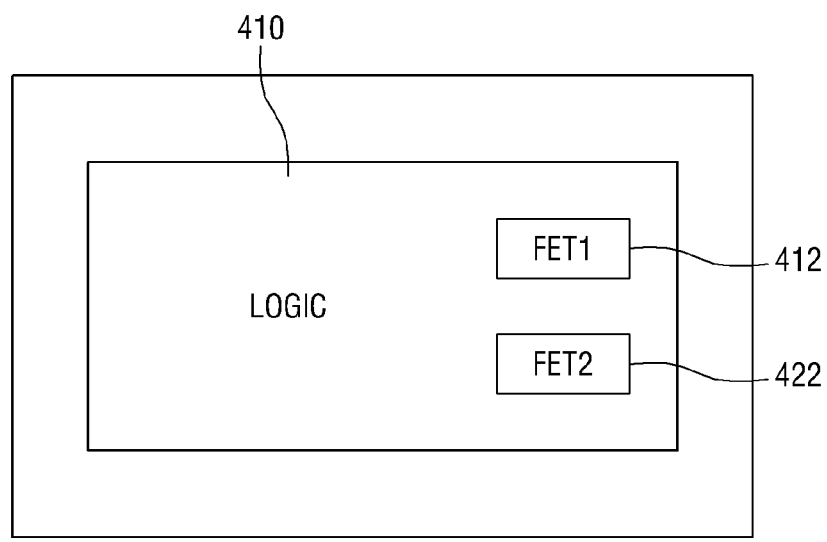
FIG. 17 is a block diagram of another semiconductor device according to the present inventive concept.

Referring to FIG. 17, a semiconductor device 8 according to the present inventive concept may include a logic region 410. First and second FET-based devices 412 and 422 may be both disposed in the logic region 410. In another embodiment (not shown), the first and second FET-based device 412 and 422 may be both disposed in a logic region.

In this embodiment of a semiconductor device 8, the first FET-based device 412 may also be embodied as any one of the semiconductor devices 2 to 5 according to the present inventive concept and the second FET-based device 422 may be embodied as any other of the semiconductor devices 2 to 5 according to the present inventive concept.

Next, an electronic system including semiconductor devices according to the present inventive concept will be described with reference to FIG. 18.

Figure 18:
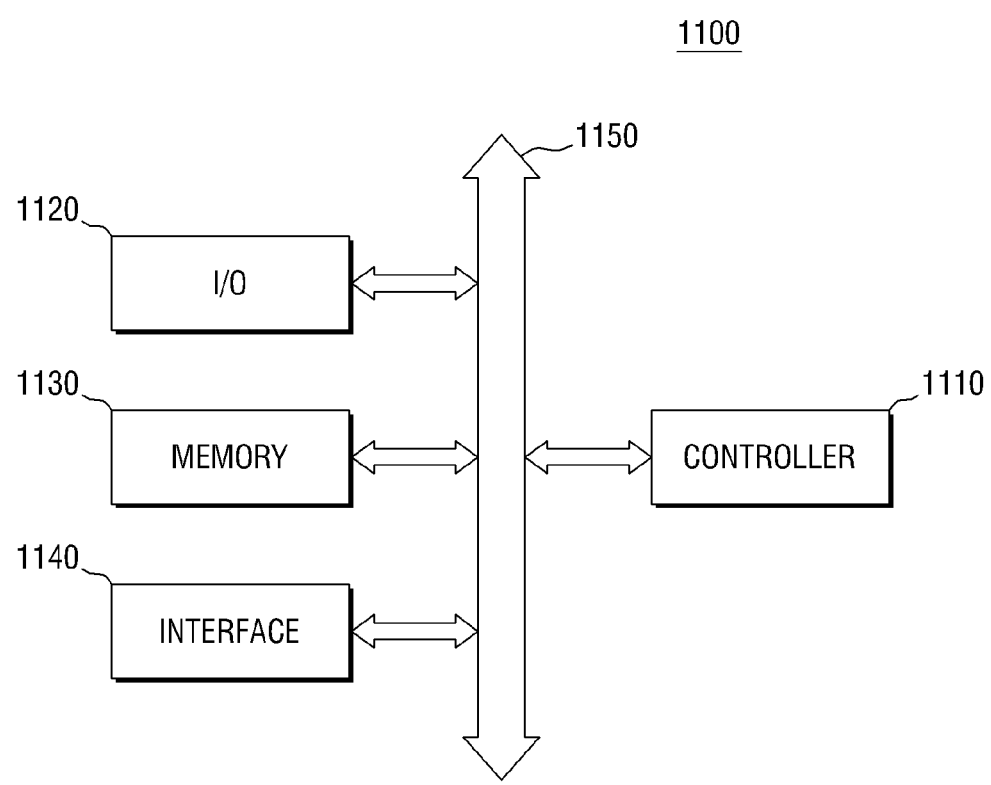
FIG. 18 is a block diagram of an electronic system including semiconductor devices according to the present inventive concept.

Referring to FIG. 18, an electronic system 1100 according to the present inventive concept may include a controller 1110, an input/output device (I/O) 1120, a memory 1130, an interface 1140, and a bus 1150. The controller 1110, the I/O 1120, the memory 1130 and/or the interface 1140 may be connected to each other through the bus 1150. The bus 1150 defines a path along which data is transmitted.

The controller 1110 may include at least one of a microprocessor, a digital signal processor, a microcontroller, and logic devices capable of performing functions similar to those of these components. The I/O 1120 may include a keypad or a keyboard, and a display, or the like. The memory 1130 may store data and/or commands. The interface 1140 may transmit data to a communications network or receive data from the communications network. The interface 1140 may be wired or wireless. For example, the interface 1140 may include an antenna or a wired/wireless transceiver.

The memory 1130 of the electronic system 1100 may include a high-speed DRAM and/or SRAM, and the electronic system 1100 may be constituted by any of the semiconductor devices 2 to 8 according to the present inventive concept, to enhance the operation of the controller 1110. That is, the memory 1130 or some other component such as the controller 1110, the I/O 1120 may include one of the semiconductor devices 2 to 8 according to the present inventive concept.

The electronic system 1100 may be employed by a personal digital assistant (PDA), a portable computer, a web tablet, a wireless phone, a mobile phone, a digital music player, a memory card, or any type of electronic device capable of transmitting and/or receiving information in a wireless environment.

Figure 19:
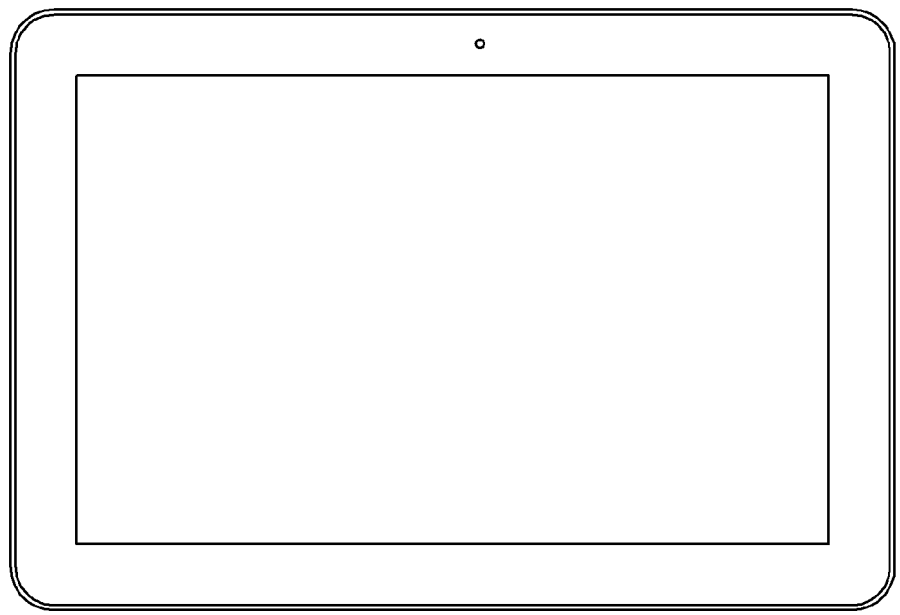
FIGS. 19, 20 and 21 illustrate examples of electronic devices having semiconductor devices according to the present inventive concept can be applied.
Figure 20:
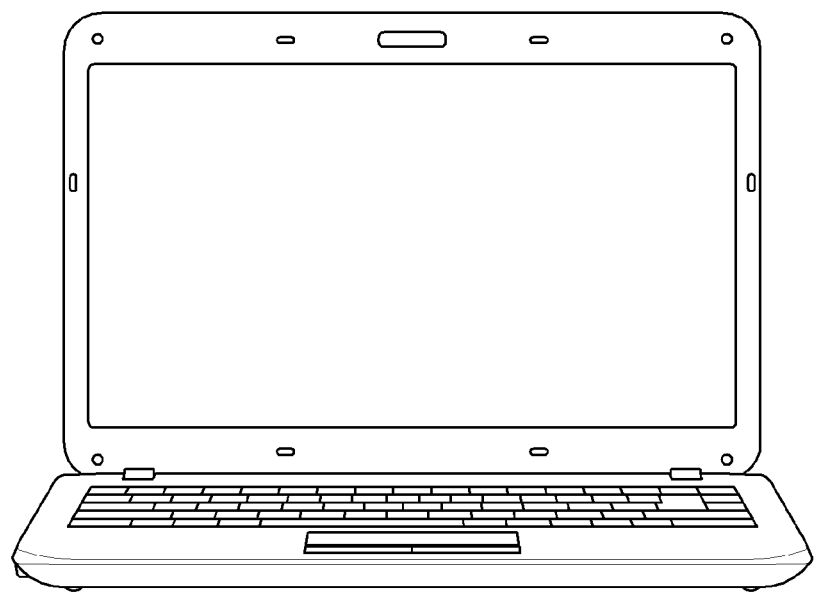
Figure 21:
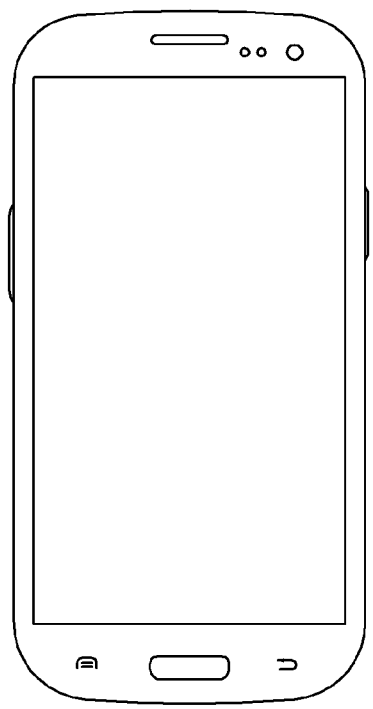

FIGS. 19 to 21 show examples of electronic device to which semiconductor devices according to the present inventive concept can be applied.

FIG. 19 illustrates a tablet PC 1200, FIG. 20 illustrates a notebook computer 1300 and FIG. 21 illustrates a smart phone 1400.

Other examples of electronic devices that may employ a semiconductor device, according to the inventive concept, include a computer, an ultra mobile personal computer (UMPC), a work station, a net-book, a personal digital assistant (PDA), a portable computer, a web tablet, a wireless phone, a mobile phone, an e-book, a portable multimedia player (PMP), a potable game console, a navigation device, a black box, a digital camera, a 3-dimensional (3D) television, a digital audio recorder, a digital audio player, a digital picture recorder, a digital picture player, digital video recorder, and a digital video player, although this list is not exhaustive.

Hereinafter, an embodiment of a method of fabricating a semiconductor device according to the present inventive concept will be described with reference to FIGS. 22A to 25B.

Figure 22A:
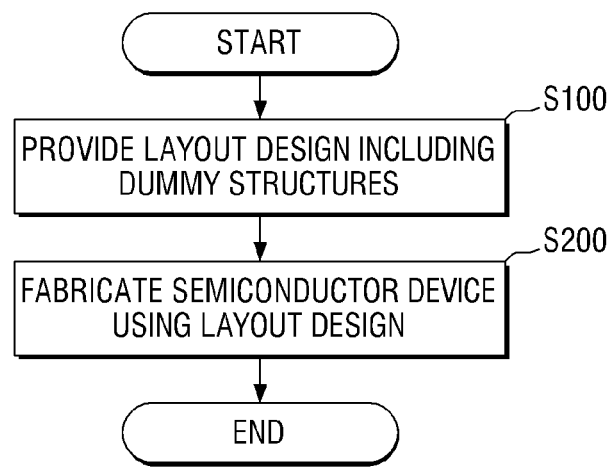
FIG. 22A is a flowchart of a method for fabricating semiconductor devices according to the present inventive concept.
Figure 22B:
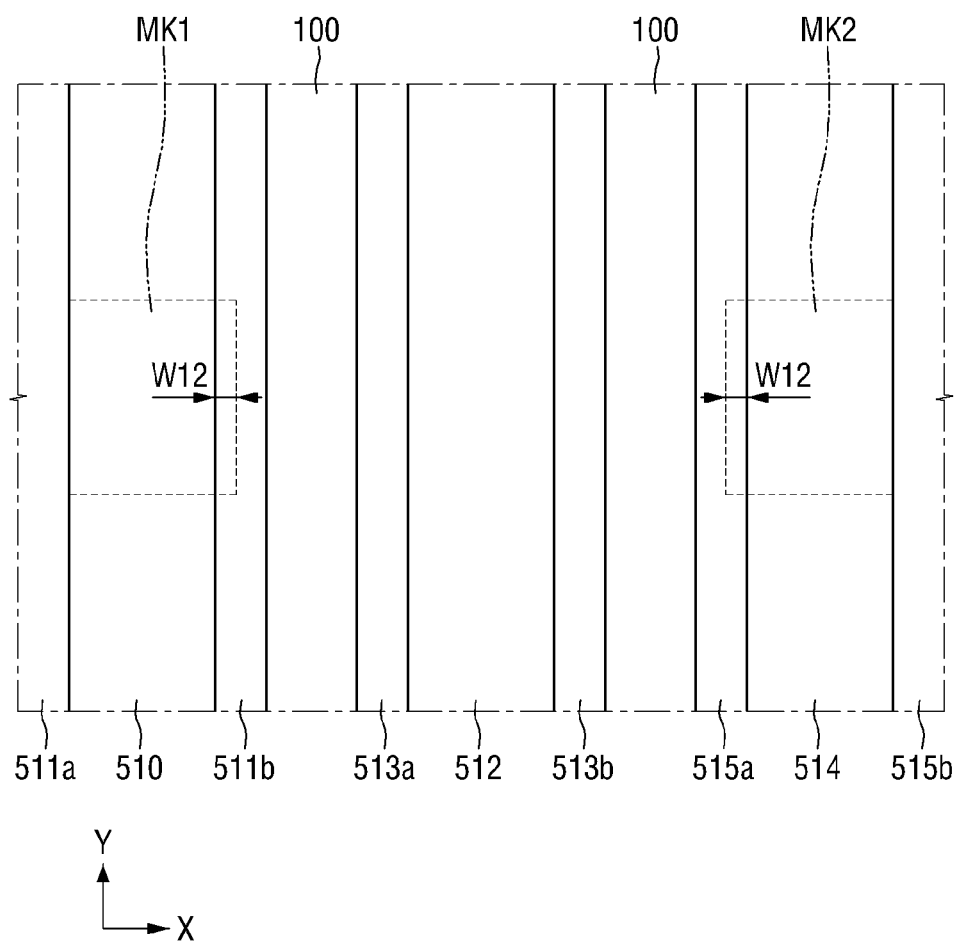
Figure 23B:
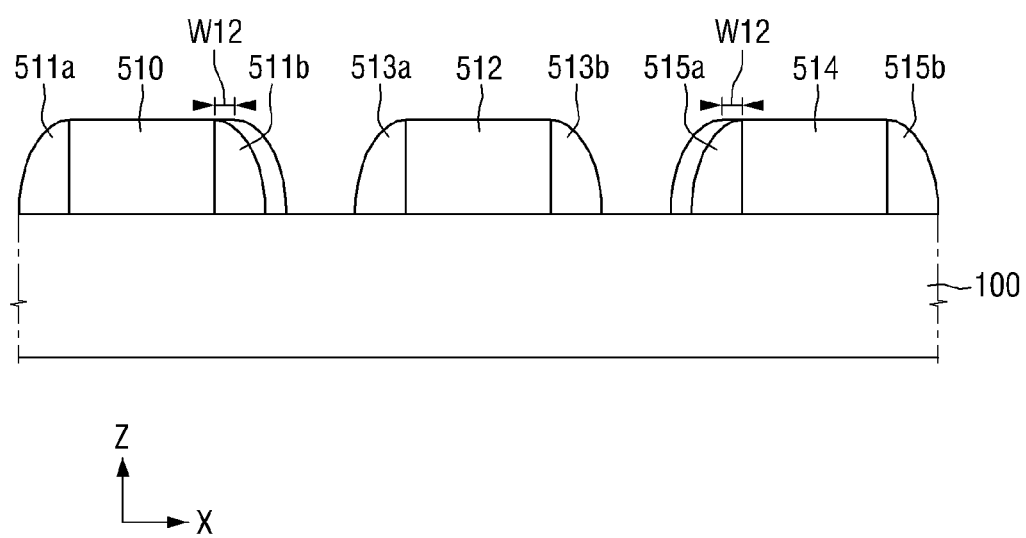

Referring to FIGS. 22A and 22B, a layout design including virtual versions of dummy structures 510, 512, and 514 is created (S100).

More specifically, the layout design including dummy structures may be created by a layout design system of the type described with reference to FIG. 1. A process of architecting the layout design will now be described. The process of architecting the layout design is largely divided into a first layout design step and a second layout design step. Here, the layout design may be the aforementioned chip design 50, but the present inventive concept is not limited thereto.

First, and referring to FIG. 22B, the first layout design step includes creating virtual first and second markers MK1 and MK2 in regions of dummy structures 510 and 514, respectively, but not in intervening dummy structure 512, and thereby creating a first offset W12 for the regions having the first and second markers MK1 and MK2 therein.

Next, and referring to FIG. 23A, the second layout design step includes extending the regions of the dummy structures 510 and 514 outwardly by the first offset W12, and thereby defining dummy spacers 511a, 511b, 513a, 513b, 515a and 515b at opposite sides of the dummy structures 510, 512 and 514.

Referring again to FIG. 22A, a semiconductor device is fabricated using the layout design (S200).

More specifically, actual versions of the dummy structures 510, 512 and 514 and the dummy spacers 511a, 511b, 513a, 513b, 515a and 515b are formed using the layout design. The process of forming the dummy structures 510, 512 and 514 and the dummy spacers 511a, 511b, 513a, 513b, 515a and 515b will be described more specifically with reference to FIG. 23B.

First, a first insulation layer (not shown) is formed on the active layer 100 using CVD or PECVD. A first mask layer (not shown) is then formed on the first insulation layer (not shown) and the first mask layer is patterned according to the layout design. Subsequently, the first insulation layer is etched using the patterned first mask layer as a mask, thereby forming the dummy structures 510, 512 and 514 extending in the first direction Y. Here, the dummy structures 510, 512 and 514 may be referred to as mandrels. The dummy structures 510, 512 and 514 may be an oxide layer, a nitride layer, an oxynitride layer or a combination thereof, or may include an organic material, such as SOH or photoresist, but the present inventive concept is not limited thereto.

Next, a second insulation layer (not shown), covering the dummy structures 510, 512 and 514, is formed on the dummy structures 510, 512 and 514. Then, the second insulation layer is patterned, thereby forming dummy spacers 511a, 511b, 513a, 513b, 515a and 515b at opposite sides of the dummy structures 510, 512 and 514 in the first direction Y, as shown. Anisotropic etching, for example, may be used in forming the dummy spacers 511a, 511b, 513a, 513b, 515a and 515b.

The dummy spacers 511a, 511b, 513a, 513b, 515a and 515b may include, for example, oxynitride, but the present inventive concept is not limited thereto.

The thus formed dummy structures 510, 512 and 514 and the dummy spacers 511a, 511b, 513a, 513b, 515a and 515b may have the same shapes/pattern as the virtual versions in the layout design described above.

Figure 24A:
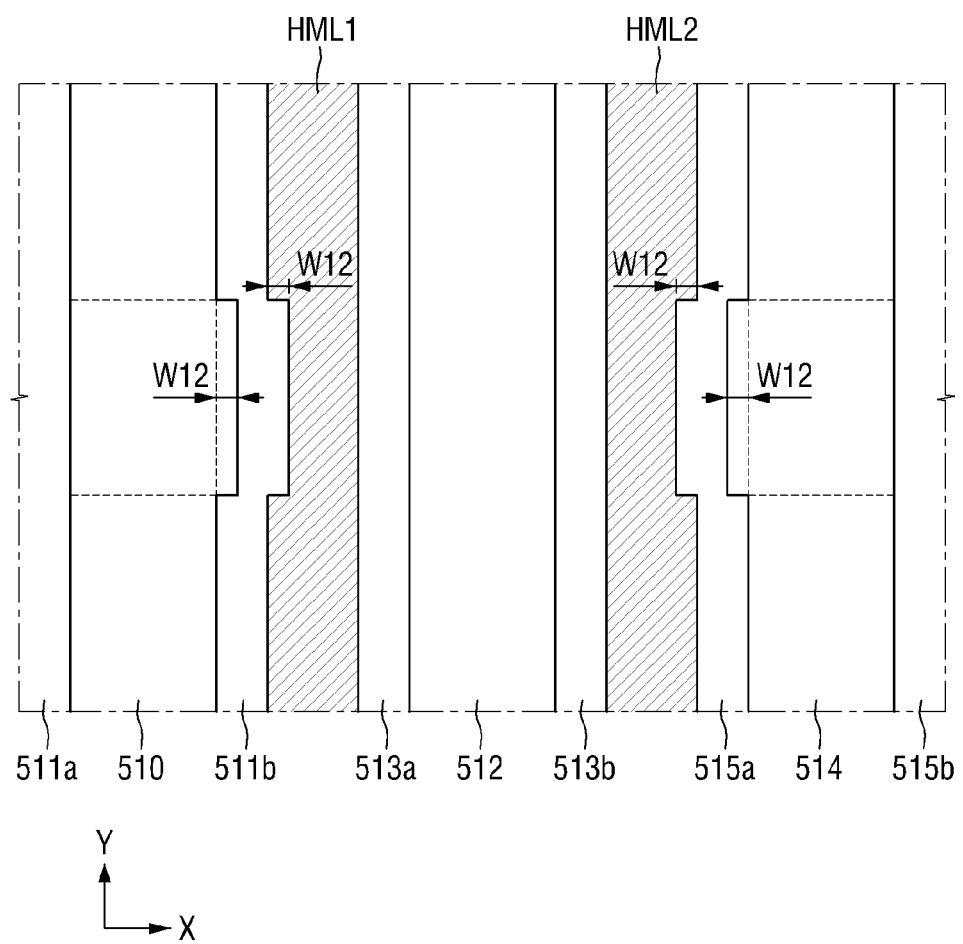
Figure 24B:
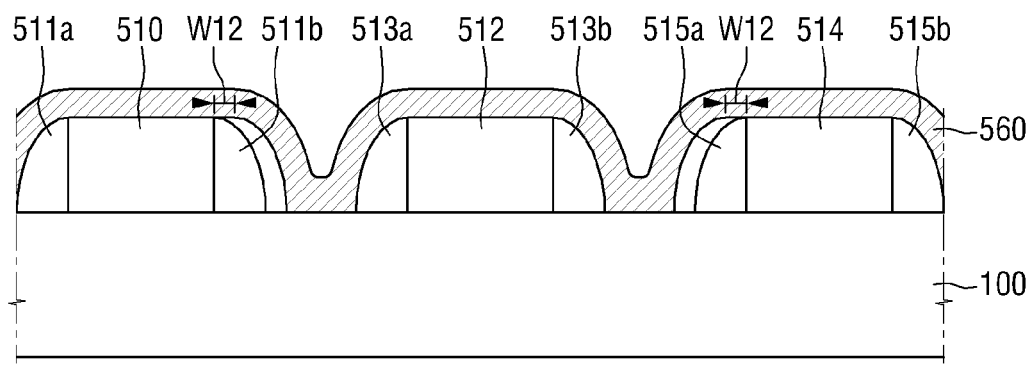
Figure 24C:
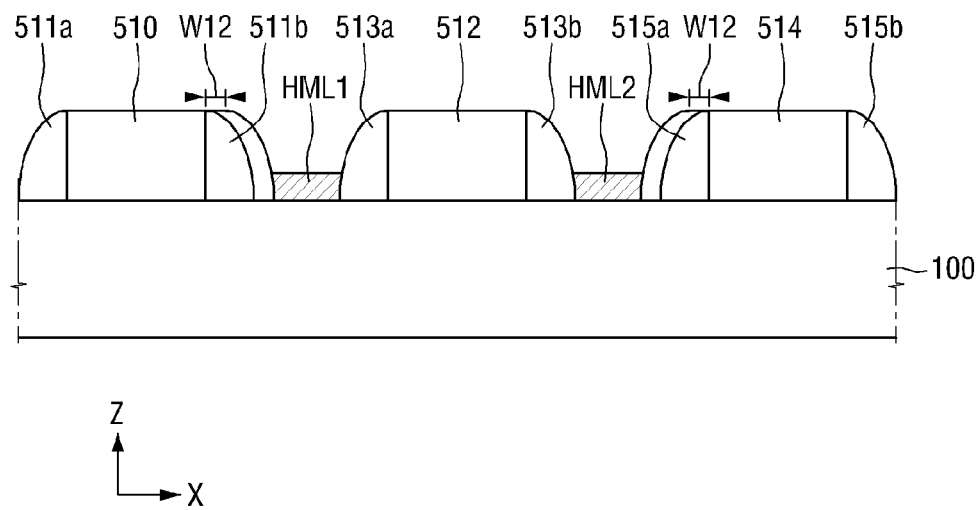

Referring to FIGS. 24A to 24C, a second mask layer 560 covering the dummy structures 510, 512 and 514 and the dummy spacers 511a, 511b, 513a, 513b, 515a and 515b is formed and then etched to expose the dummy structures 510, 512 and 514 and the dummy spacers 511a, 511b, 513a, 513b, 515a and 515b, thereby forming first and second hard mask layers HML1 and HML2 between the first dummy spacer 511b and the second dummy spacer 513a and between the second dummy spacer 513b and the third dummy spacer 515a, as shown in FIG. 24C. In the illustrated embodiment, the height of the formed hard mask layer (e.g., HML1 or HML2) in a third direction Z may be smaller than the height of each of the dummy spacers 511a, 511b, 513a, 513b, 515a and 515b in the third direction Z, but the present inventive concept is not limited thereto.

Figure 25A:
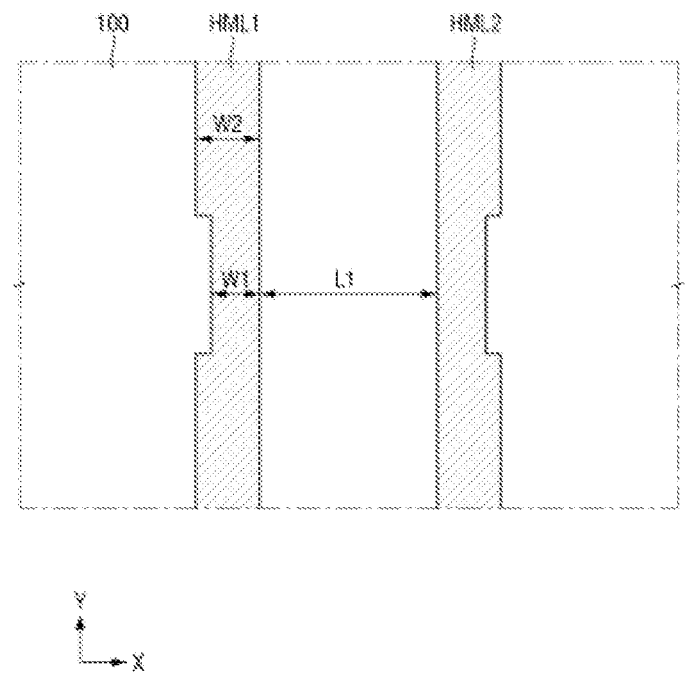
Figure 25B:
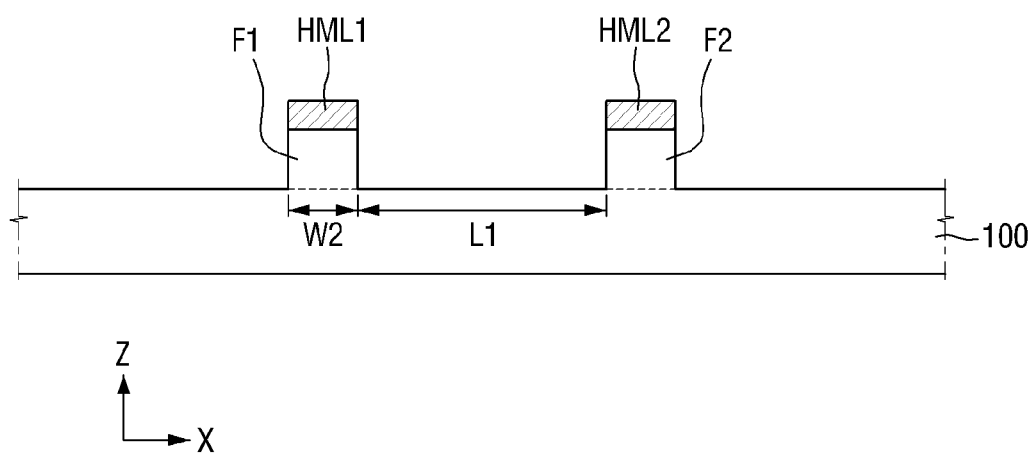

Referring to FIGS. 25A and 25B, the dummy structures 510, 512 and 514 and the dummy spacers 511a, 511b, 513a, 513b, 515a and 515b are removed, thereby exposing the active layer 100.

In addition, the active layer 100 is etched to a predetermined depth using the first and second hard mask layers HML1 and HML2 as masks. As a result, first and second active fins F1 and F2 may be formed, as shown in FIG. 6. That is, FIGS. 24A to 27B illustrate processes of fabricating some portions of the semiconductor device 1 shown in FIG. 5, and similar other portions may also be fabricated by the same processes illustrated in FIGS. 24A to 27B.

Referring back to FIGS. 5 and 6, after the active fins F1 to F4 are formed, the gate structure 192 and the spacer 115 extending in the second direction X may be formed on the hard mask layers HML1 to HML4. FIGS. 5 and 6 illustrate that the gate structure 192 and the spacer 115 are formed on the hard mask layers HML1 to HML4 in a state in which the hard mask layers HML1 to HML4 are present. Alternatively, the gate structure 192 and the spacer 115 may be formed on the active fins F1 to F4 after the hard mask layers HML1 to HML4 are removed.

In the above-described fabricating method, the hard mask layers HML1 to HML4 are formed in a self-aligned manner. Therefore, the fabrication process is simplified and widths of the active fins F1 to F4 can be easily controlled. In addition, in the course of forming active fins having various widths, the number of required masks (e.g., etch masks) is minimized, thereby improving production efficiency.

Hereinafter, another method of fabricating a semiconductor device according to the present inventive concept will be described with reference to FIGS. 26 to 29B.

FIGS. 26 to 29B illustrate intermediate process steps of the method and the same parts as the method as described previously will be omitted for the sake of brevity. In addition, this method may also be carried out according to the process flow illustrated by the flowchart of FIG. 22A.

Figure 26:
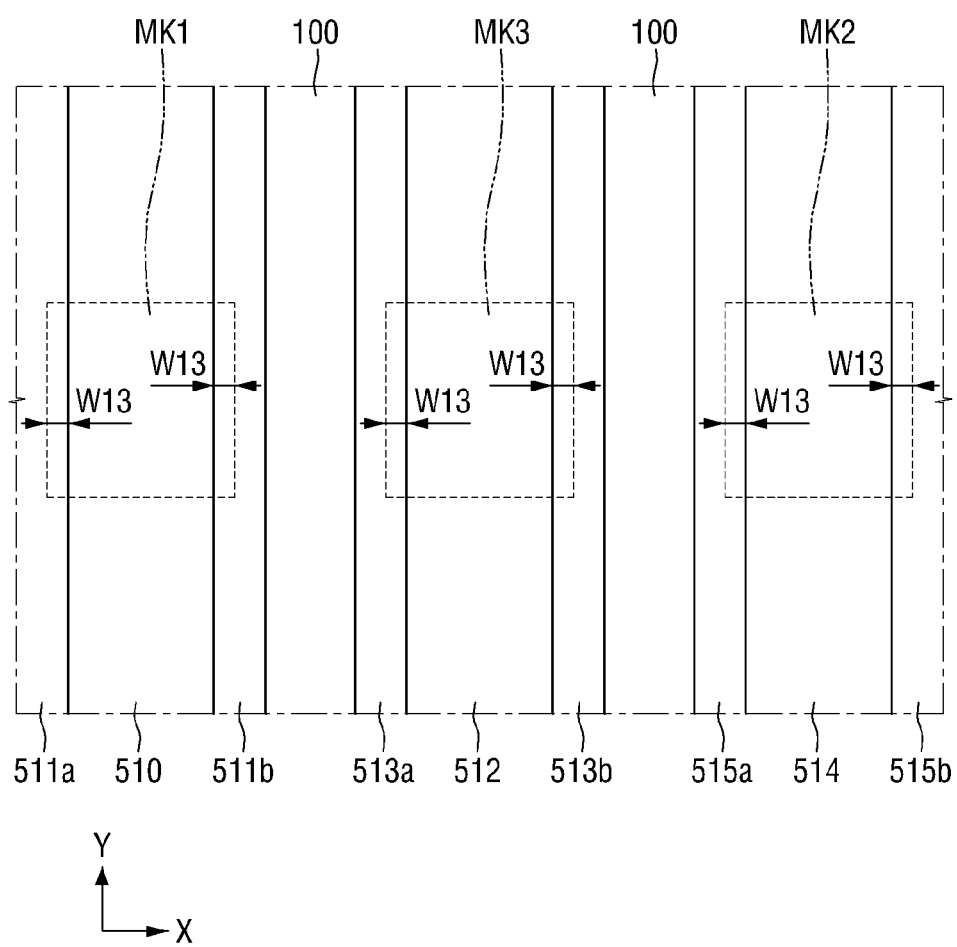

Referring to FIG. 26, in a first layout design step, first to third virtual markers MK1, MK2 and MK3 are set in regions of virtual versions of the dummy structures 510, 512 and 514. Thus, an offset W13 is created for each of the regions having the first to third markers MK1, MK2 and MK3.

Figure 27A:
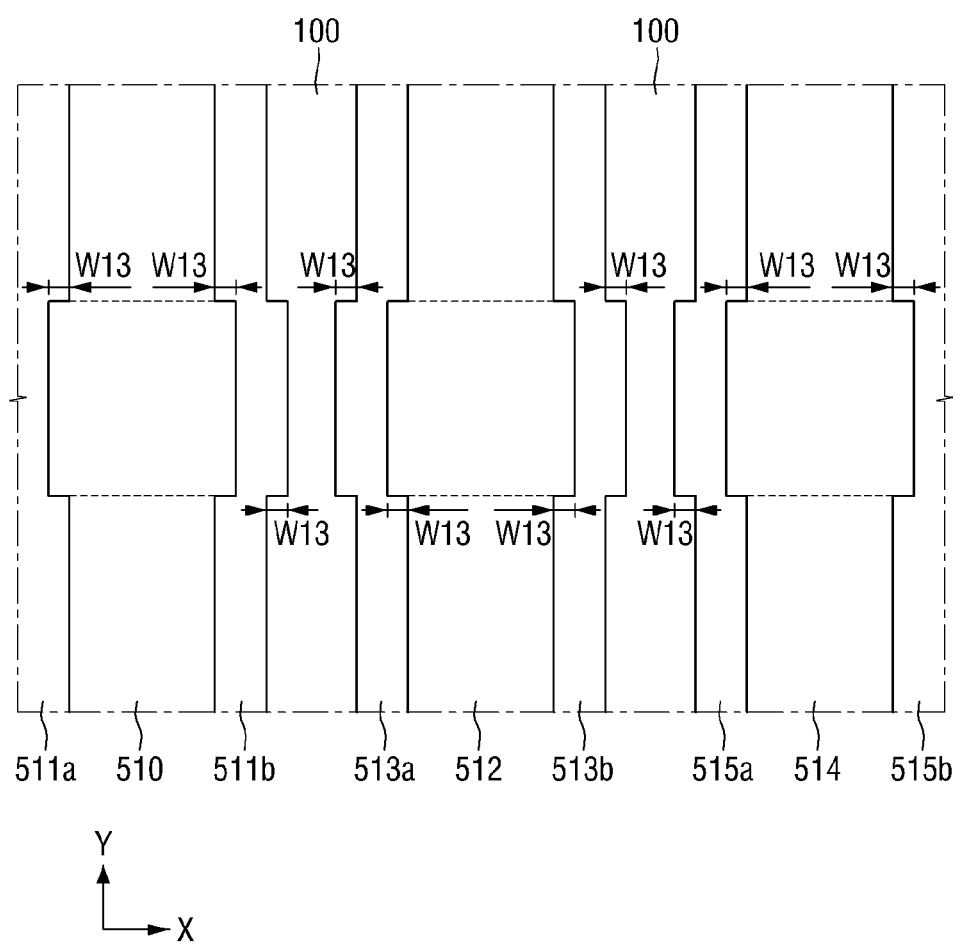

Next, referring to FIG. 27A, a second layout design step includes extending widths of the regions of the dummy structures 510, 512 and 514 having the first to third markers MK1, MK2 and MK3 by the second offset W13. As a result, virtual versions of dummy spacers 511a, 511b, 513a, 513b, 515a and 515b are provided at opposite sides of the dummy structures 510, 512 and 514.

Figure 27B:
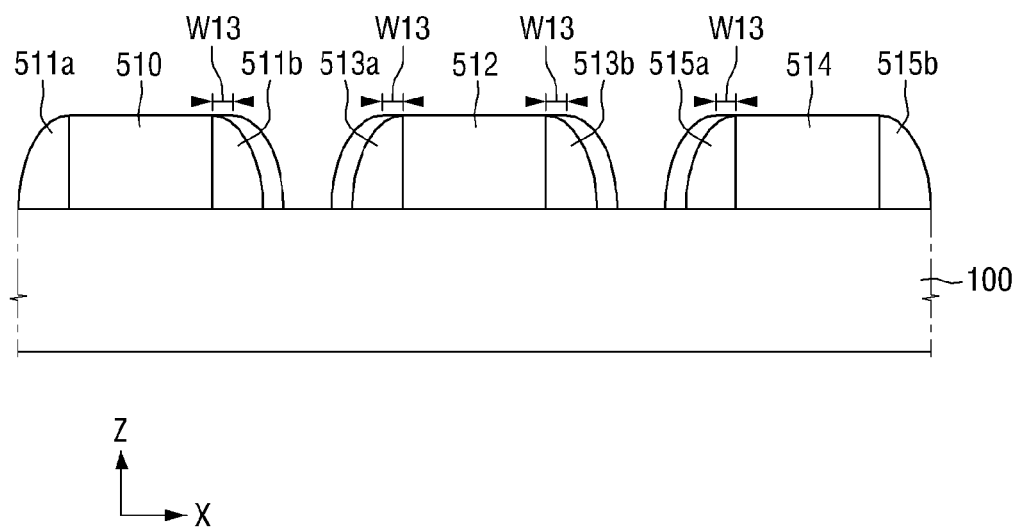

Subsequently, the layout shown in FIGS. 27A and 27B are realized, i.e., actual versions of the dummy structures 510, 512 and 514 and the dummy spacers 511a, 511b, 513a, 513b, 515a and 515b are formed.

First, actual versions of the dummy structures 510, 512 and 514 extending in the first direction Y are formed on the active layer 100 using the above-described layout design.

Next, the dummy spacers 511a, 511b, 513a, 513b, 515a and 515b extending in the first direction Y are formed at opposite sides of the dummy structures 510, 512 and 514.

Figure 28B:
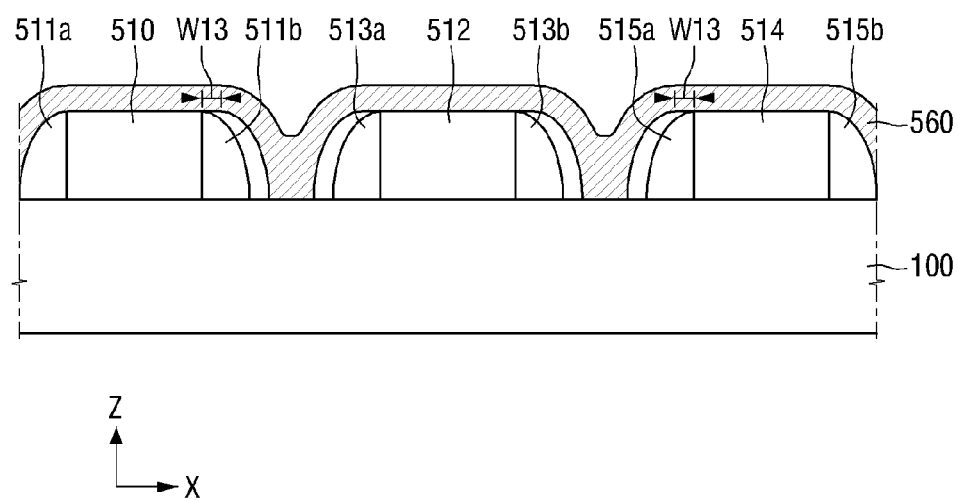
Figure 28C:
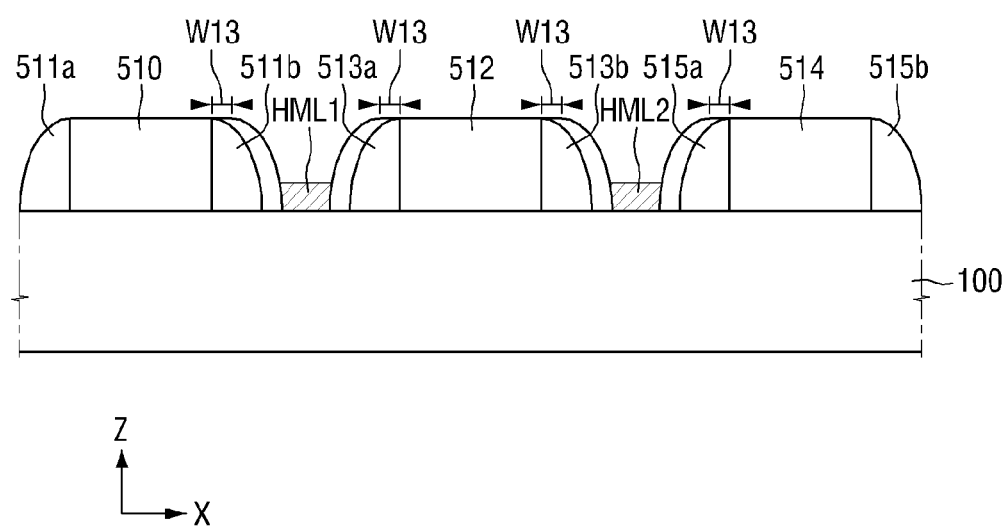

Referring to FIGS. 28A and 28B, the first and second hard mask layers HML1 and HML2 are formed between the first dummy spacer 511b and the second dummy spacer 513a and between the second dummy spacer 513b and the third dummy spacer 515a through the etching process shown in FIGS. 24A to 24C, respectively.

Figure 29B:
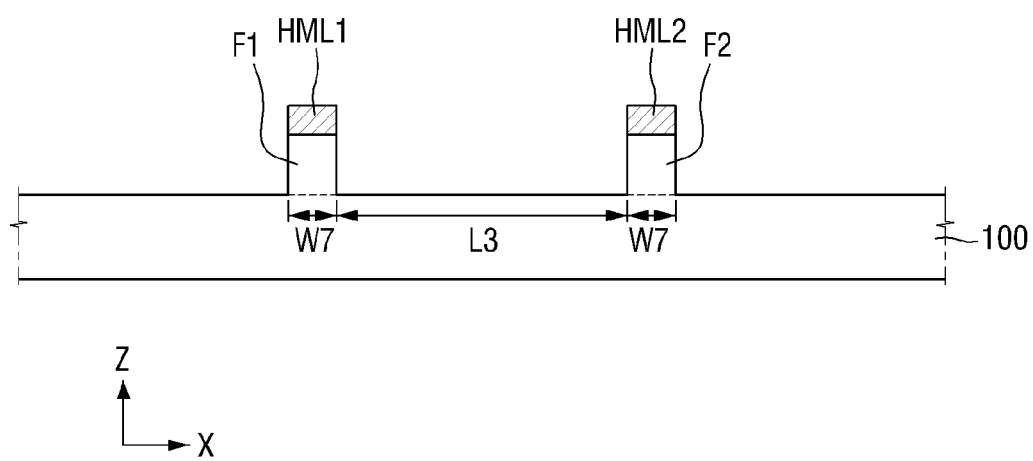

Referring to FIGS. 29A and 29B, the dummy structures 510, 512 and 514 and the dummy spacers 511a, 511b, 513a, 513b, 515a and 515b are removed. Thus, the active layer 100 is exposed.

In addition, the active layer 100 is etched to a predetermined depth using the first and second hard mask layers HML1 and HML2 as masks. As a result, the first and second active fins F1 and F2 are formed. That is, FIGS. 26 to 29B illustrate processes of fabricating portions of the semiconductor device 2 shown in FIG. 12, and similar other portions may also be fabricated by the same processes illustrated in FIGS. 26 to 29.

Referring back to FIG. 10, after the active fins F1 to F4 (positioned under the hard mask layers HML1 to HML4) are formed, a gate structure 192 and a spacer 115 extending in the second direction X may be formed on the hard mask layers HML1 to HML4. FIG. 10 illustrates that the gate structure 192 and the spacer 115 may be formed in a state in which the hard mask layers HML1 to HML4 are present. Alternatively, the gate structure 192 and the spacer 115 may be formed on the active fins F1 to F4 after the hard mask layers HML1 to HML4 are removed.

Hereinafter, another method of fabricating a semiconductor device according to the present inventive concept will be described with reference to FIGS. 30 to 34B.

FIGS. 30 to 34B illustrate intermediate process steps of the method and the same parts as the methods described previously will be omitted for the sake of brevity. In addition, this method may also be carried out according to the process flow illustrated by the flowchart of FIG. 22A.

Also, as the distinctions between virtual versions of the layout design and actual versions of the corresponding features of the device have been made clear from the foregoing descriptions, the terms "virtual" and "actual" will be omitted from the following descriptions.

Figure 30:
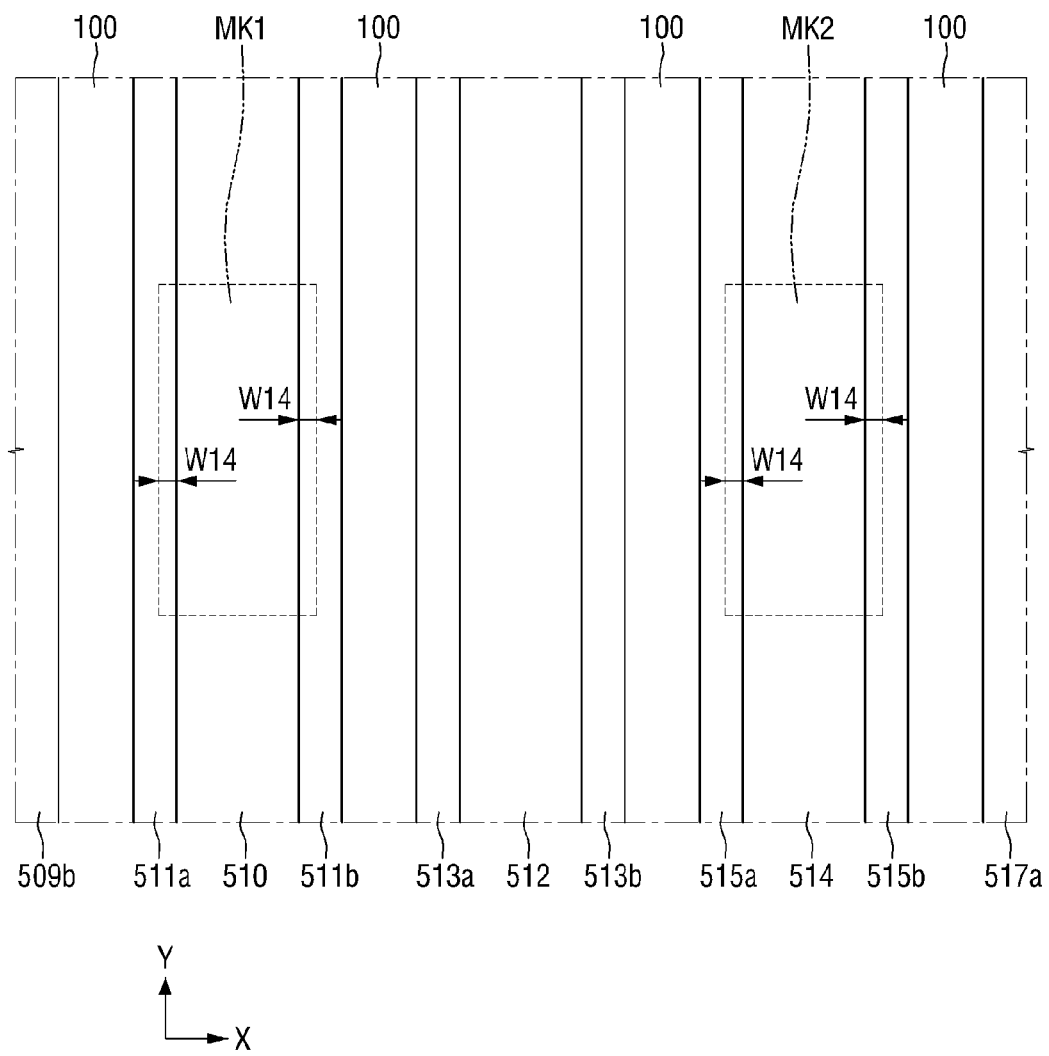
FIGS. 30, 31A, 31B, 32A, 32B, 32C, 33A, 33B, 34A and 34B illustrate a third embodiment of a method of fabricating a semiconductor device according to the present inventive concept.

Referring to FIG. 30, in the first layout design step, first and second markers MK1 and MK2 are set in regions of dummy structures 510 and 514, but a marker is not set in intervening dummy structure 512. Thus, an offset W14 for the regions having the first and second markers MK1 and MK2 set is created.

Figure 31A:
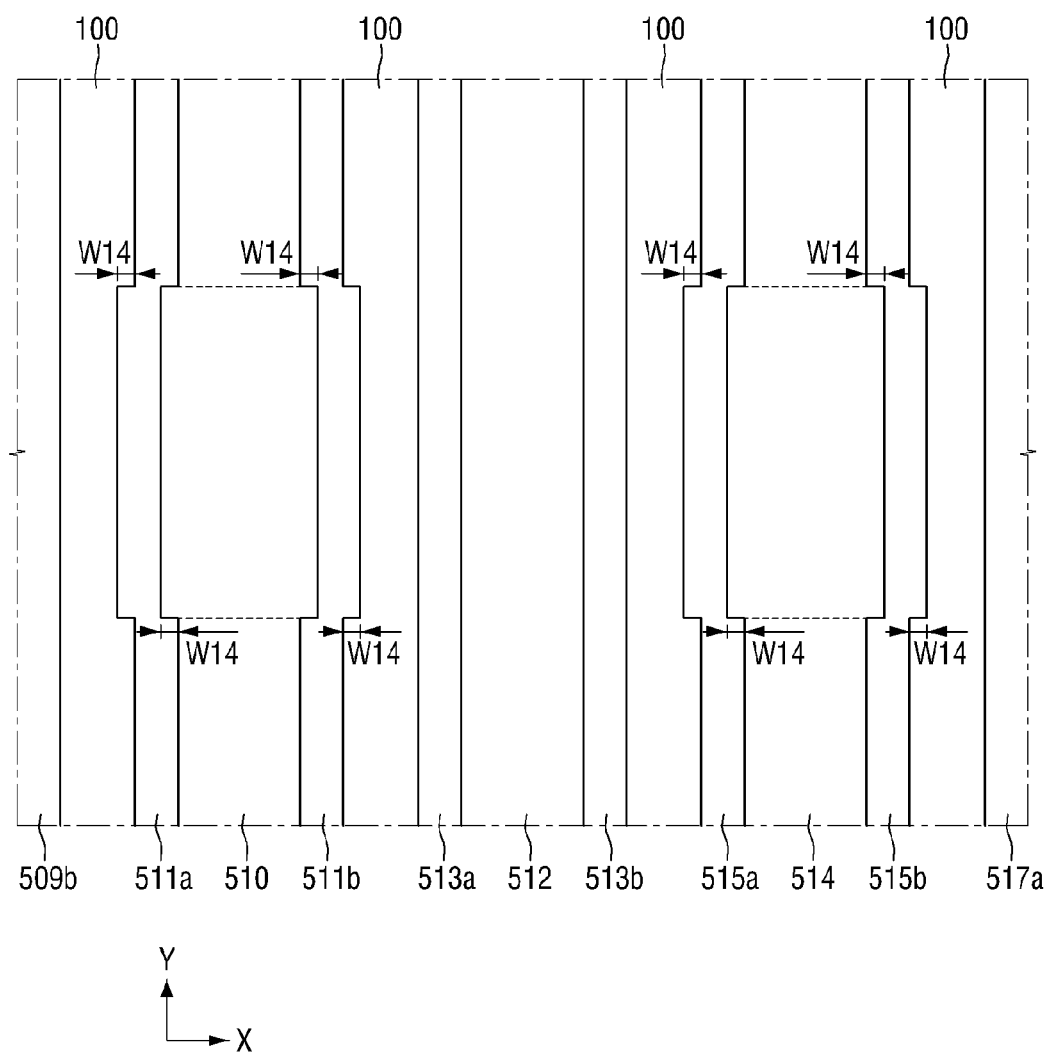

Next, referring to FIG. 31A, the second layout design step includes extending widths of the regions of the dummy structures 510 and 514 having the first and second markers MK1 and MK2 set thereto by the third offset W14. Thus, dummy spacers 509b, 511a, 511b, 513a, 513b, 515a, 515b and 517a are defined at opposite sides of the dummy structures 510, 512 and 514.

Figure 31B:
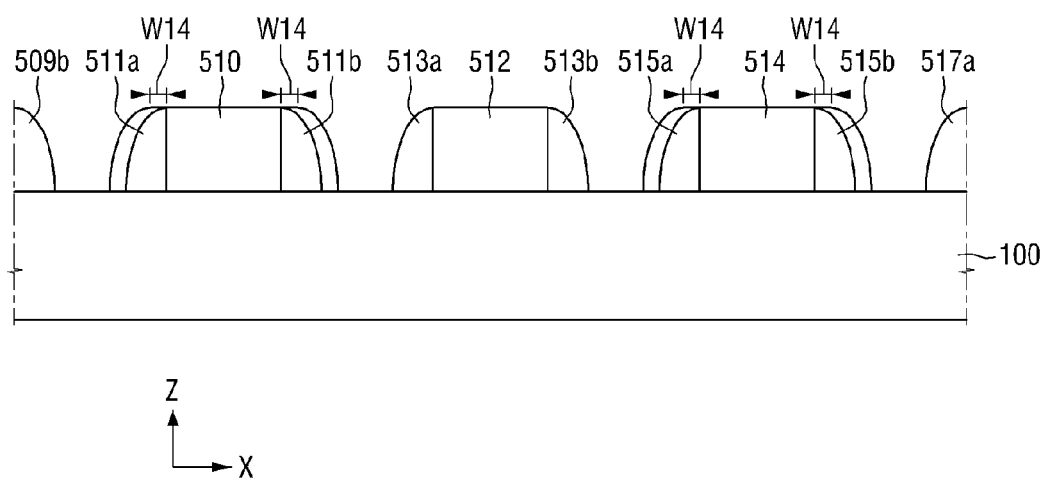

Subsequently, the layout shown in FIGS. 31A and 31B is realized, i.e., the dummy structures 510, 512 and 514 and the dummy spacers 509b, 511a, 511b, 513a, 513b, 515a, 515b and 517a are formed using the layout design.

First, the dummy structures 510, 512 and 514 extending in the first direction Y are formed on the active layer 100 using the above-described layout design.

Next, the dummy spacers 509b, 511a, 511b, 513a, 513b, 515a, 515b and 517a extending in the first direction Y are formed at opposite sides of the dummy structures 510, 512 and 514.

Figure 32A:
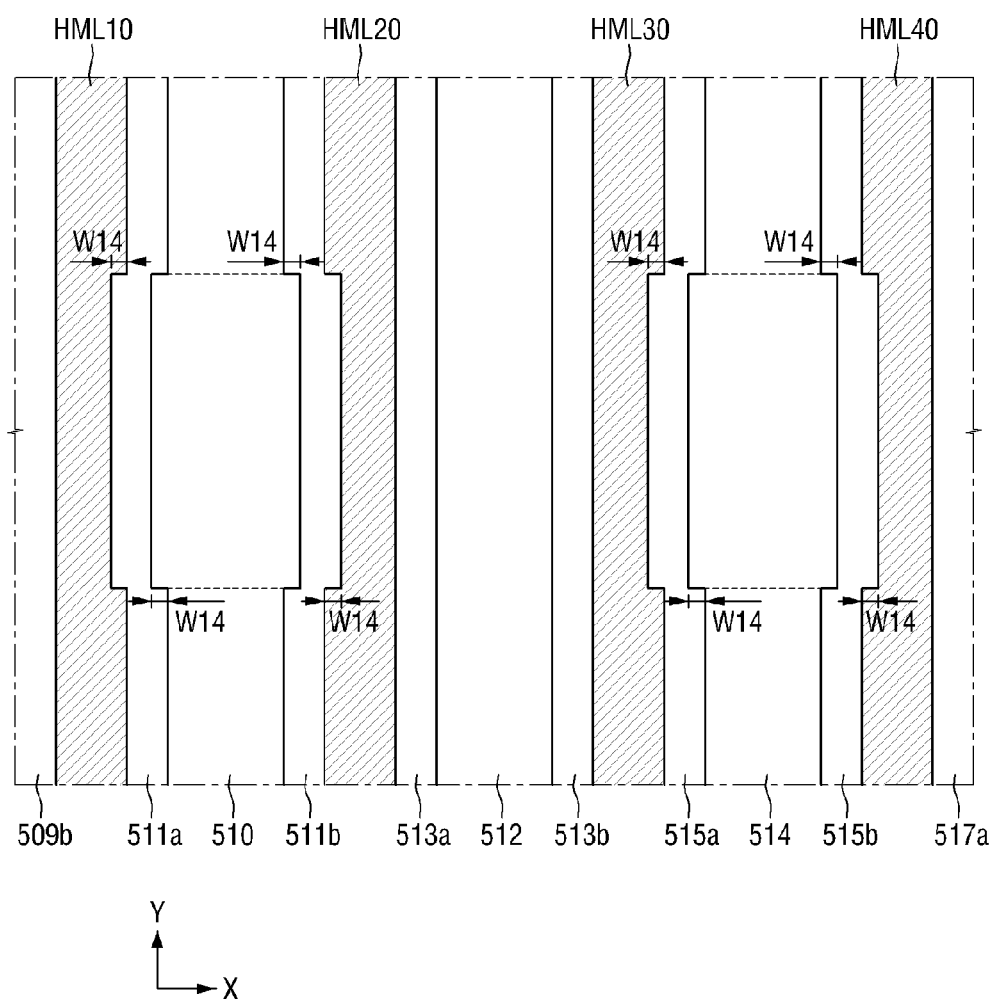
Figure 32B:
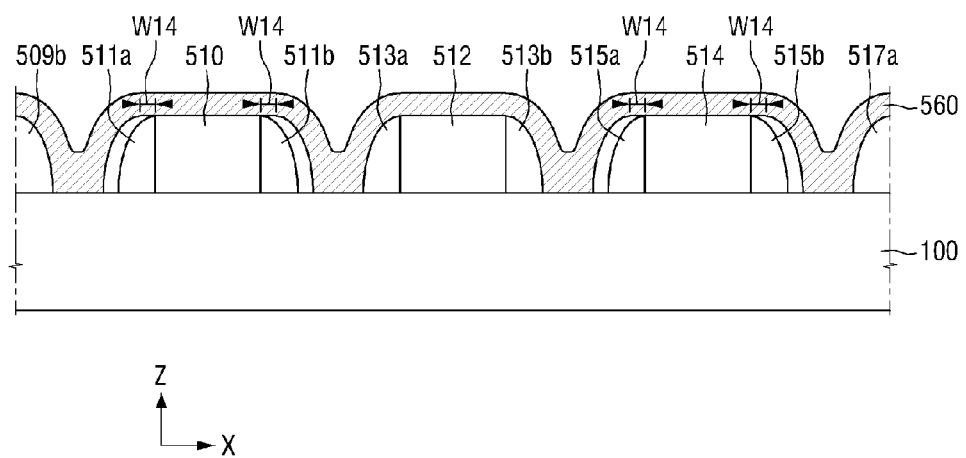
Figure 32C:
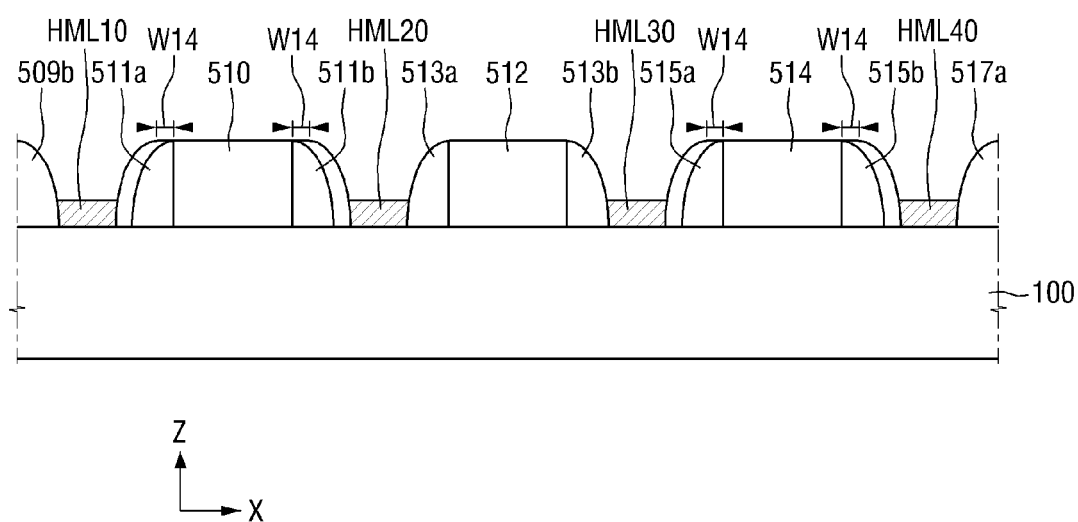

Referring to FIGS. 32A to 32C, hard mask layers HML10, HML20, HML30 and HML40 are formed between the first dummy spacer 511b and the fourth dummy spacer 509b, between the first dummy spacer 511b and the second dummy spacer 513a, between the second dummy spacer 513b and the third dummy spacer 515a and between the third dummy spacer 515b and the fifth dummy spacer 517, respectively, by an etching process similar to that shown in and described with reference to FIGS. 24A to 24C.

Figure 33A:
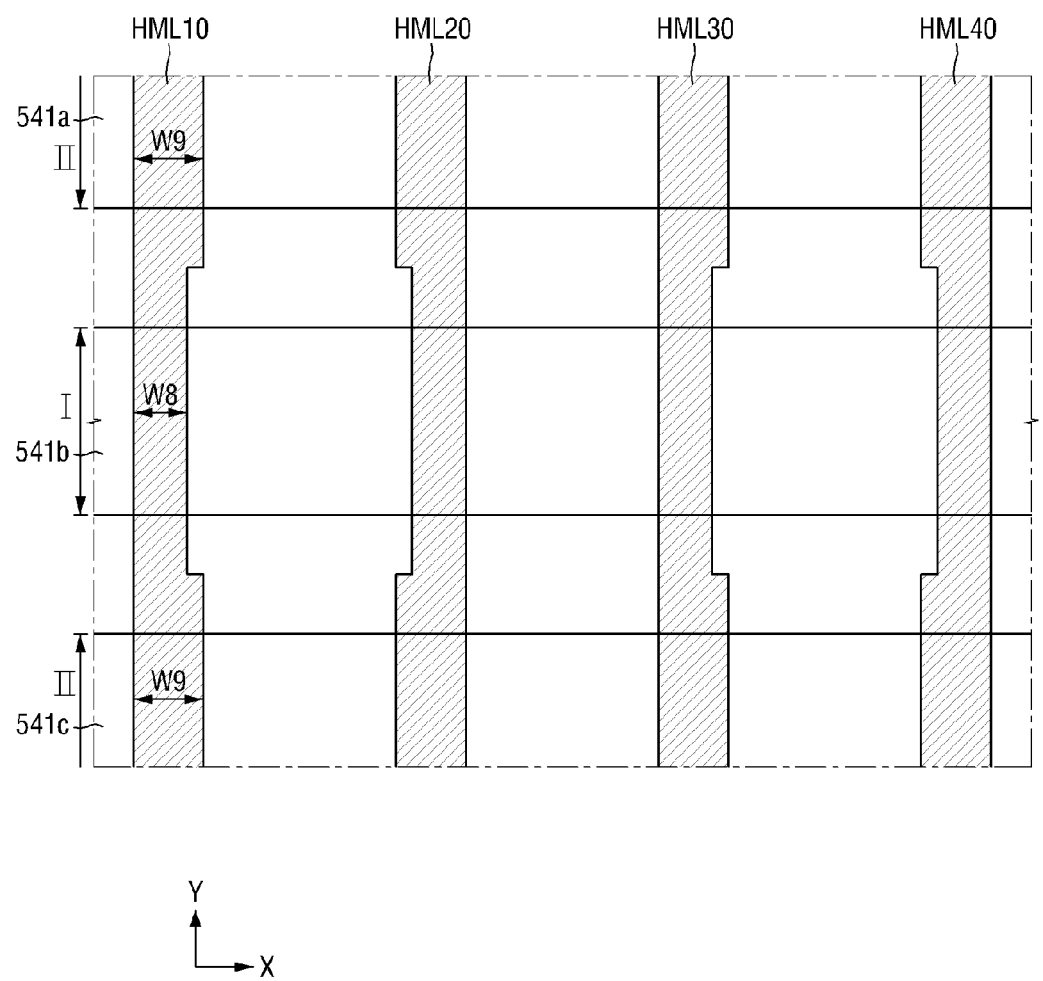
Figure 33B:
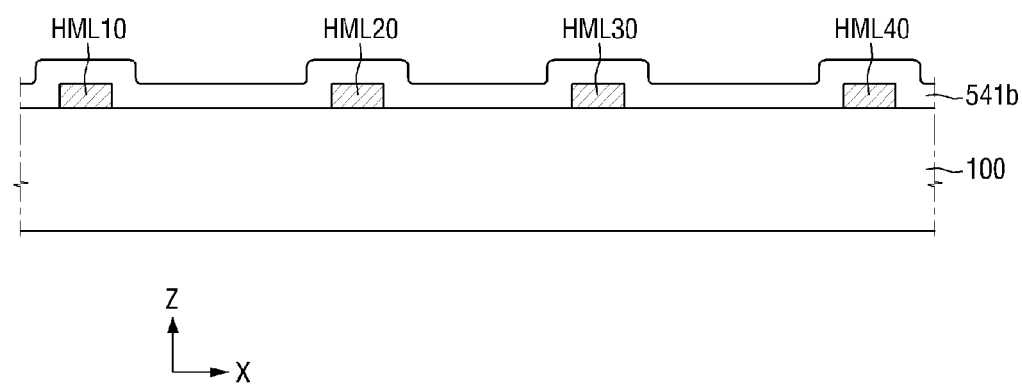

Referring to FIGS. 33A and 33B, after the dummy structures 510, 512 and 514 and the dummy spacers 509b, 511a, 511b, 513a, 513b, 515a, 515b and 517a are removed, second, third and fourth mask layers 541a, 541b and 541c extending in the second direction X are formed on the hard mask layers HML10, HML20, HML30 and HML40.

More specifically, the active layer 100 is exposed by removing the dummy structures 510, 512 and 514 and the dummy spacers 509b, 511a, 511b, 513a, 513b, 515a, 515b and 517a, the third mask layer 541b is formed on first regions I of the hard mask layers HML10, HML20, HML30 and HML40 and the second and fourth mask layers 541a and 541c are formed on second regions II of the hard mask layers HML10, HML20, HML30 and HML40. Subsequently, the hard mask layers HML10, HML20, HML30 and HML40 are etched using the second to fourth mask layers 541a, 541b and 541c as masks, thereby forming hard mask layers HML11, HML12, HML13, HML21, HML22, HML23, HML31, HML32, HML33, HML41, HML42, and HML43 shown in FIG. 34A.

Figure 34A:
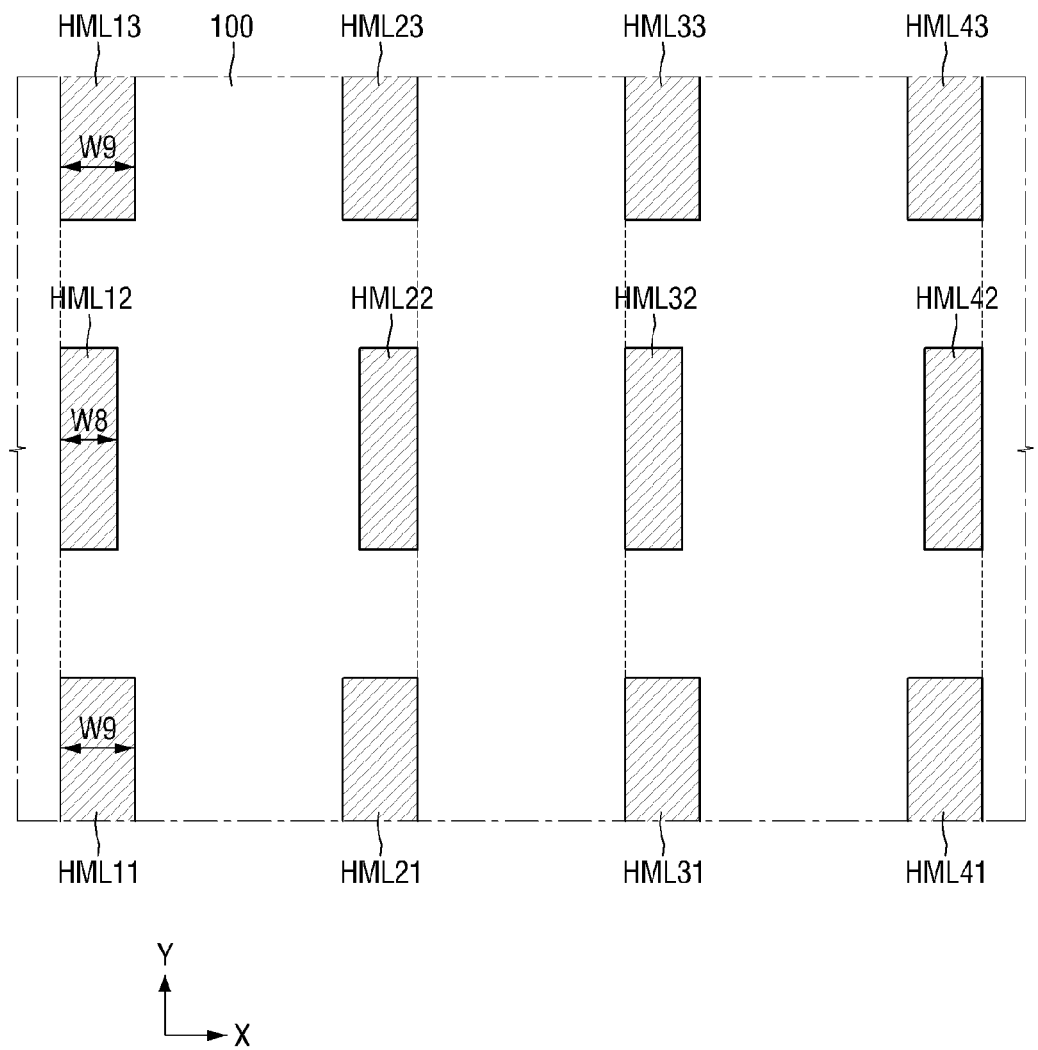
Figure 34B:
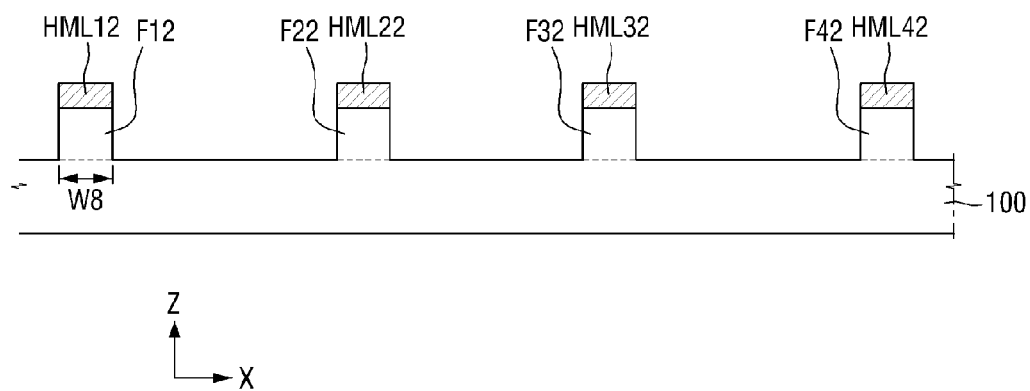

Referring to FIGS. 34A and 34B, the active layer 100 is etched to a predetermined depth using the hard mask layers HML11, HML12, HML13, HML21, HML22, HML23, HML31, HML32, HML33, HML41, HML42, and HML43 as masks. Therefore, active fins F11, F12, F13, F21, F22, F23, F31, F32, F33, F41, F42, and F43 may be formed, as shown in FIG. 6. FIGS. 30 to 34B illustrate processes of fabricating some portions of the semiconductor device 4 shown in FIG. 11, the other portions are formed in a similar manner.

Referring back to FIG. 11, after the active fins F11 to F43 (under the hard mask layers HML11 to HML43) are formed, a gate structure 192 and a spacer 115 extending the second direction X may be formed on the hard mask layers HML11 to HML43. FIG. 11 illustrates that the gate structure 192 extending in the second direction X and the spacer 115 are formed on the hard mask layers HML11 to HML43. FIG. 11 also illustrates that the gate structure 192 and the spacer 115 may be formed in a state in which the hard mask layers HML11 to HML43 are not removed. Alternatively, the gate structure 192 and the spacer 115 may be formed on the active fins F11 to F43 after the hard mask layers HML11 to HML43 are removed.

In addition, a self-aligned contact 177 for electrically connecting the active fins F11 to F13, F21 to F23, and F31 to F33 to each other may be disposed between each of the active fins F11 to F13, F21 to F23, and F31 to F33 spaced apart from each other in the first direction Y. The self-aligned contact 177 may be formed using a capping layer (179 of FIG. 12) formed on a gate electrode (162 of FIG. 12), but the present inventive concept is not limited thereto. That is, the self-aligned contact 177 is optional and not provided in some applications.

Hereinafter, still another method of fabricating a semiconductor device according to the present inventive concept will be described with reference to FIGS. 35 to 39B.

FIGS. 35 to 39B illustrate intermediate process steps of the method and the same parts as the methods described previously will be omitted for the sake of brevity. In addition, this method may also be carried out according to the process flow illustrated by the flowchart of FIG. 22A.

Figure 35:
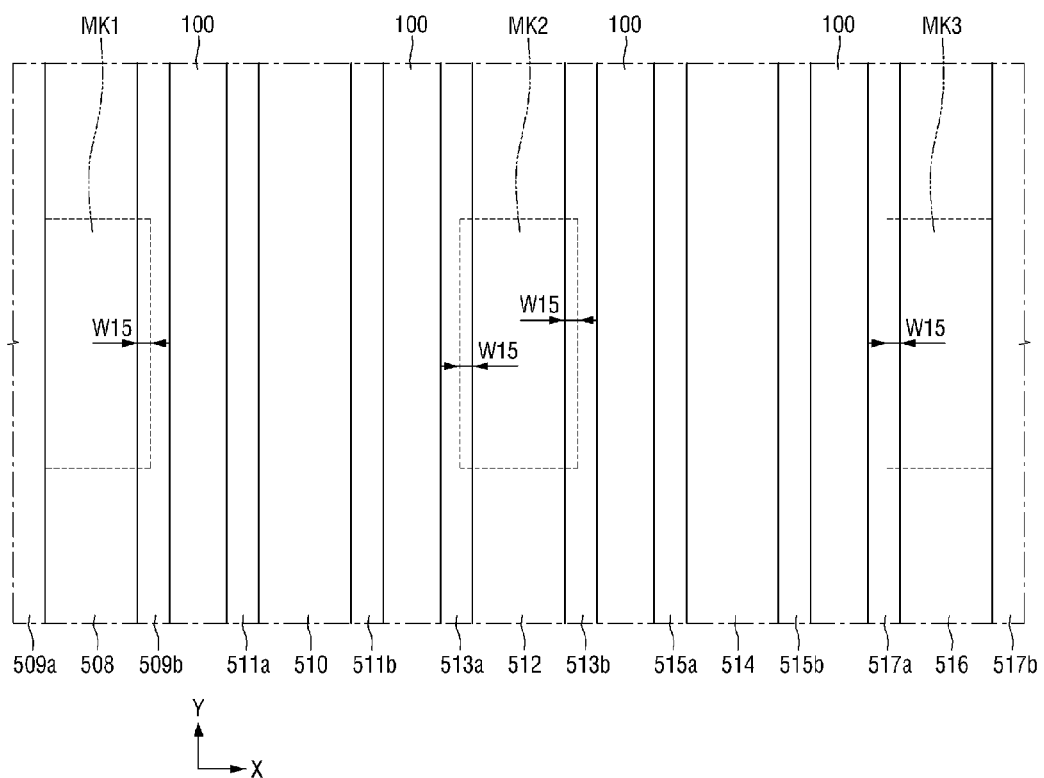
FIGS. 35, 36A, 36B, 37A, 37B, 37C, 38A, 38B, 39A and 39B illustrate a fourth embodiment of a method of fabricating a semiconductor device according to the present inventive concept.

Referring to FIG. 35, in a first layout design step, first to third markers MK1, MK2 and MK3 are set in regions of dummy structures 508, 512 and 516, respectively, but not in regions of intervening dummy structures 510, 512. Thus, a fourth offset W15 for the regions having the first to third markers MK1, MK2 and MK3 is created.

Figure 36A:
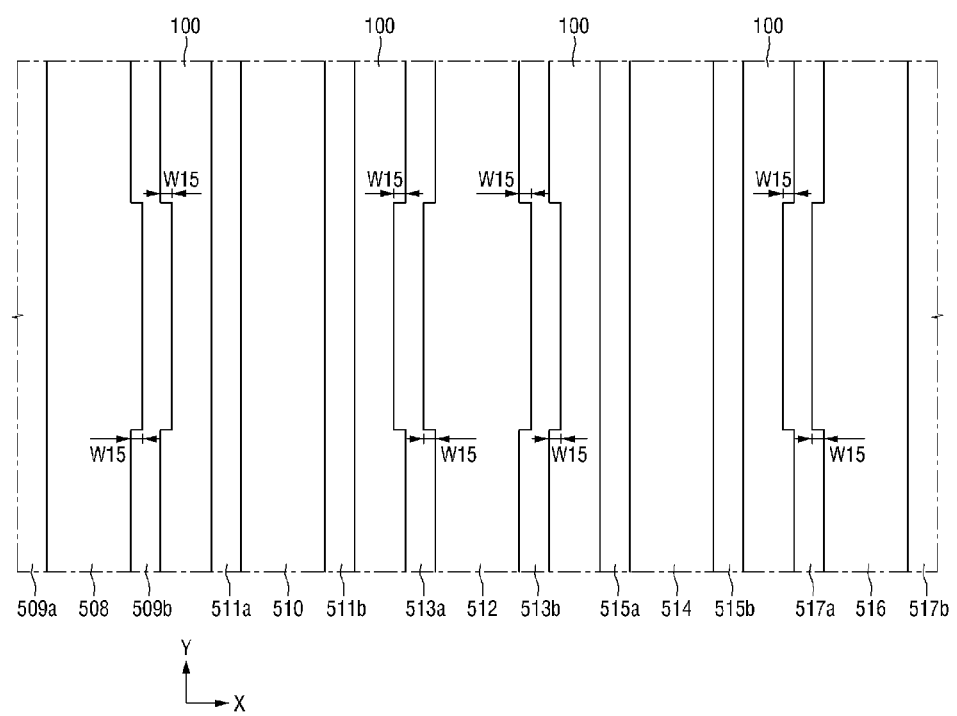
Figure 36B:
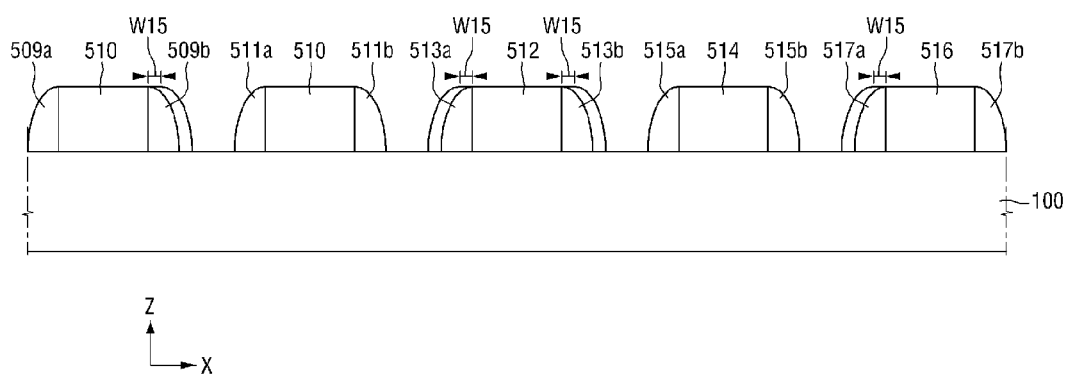

Next, referring to FIG. 36A, a second layout design step includes extending widths of the regions of the dummy structures 508, 512 and 516 having the first to third markers MK1, MK2 and MK3 by the fourth offset W15. As a result, dummy spacers 509a, 509b, 511a, 511b, 513a, 513b, 515a, 515b, 517a, and 517b are defined at opposite sides of the dummy structures 508, 510, 512, 514, and 516.

Figure 38A:
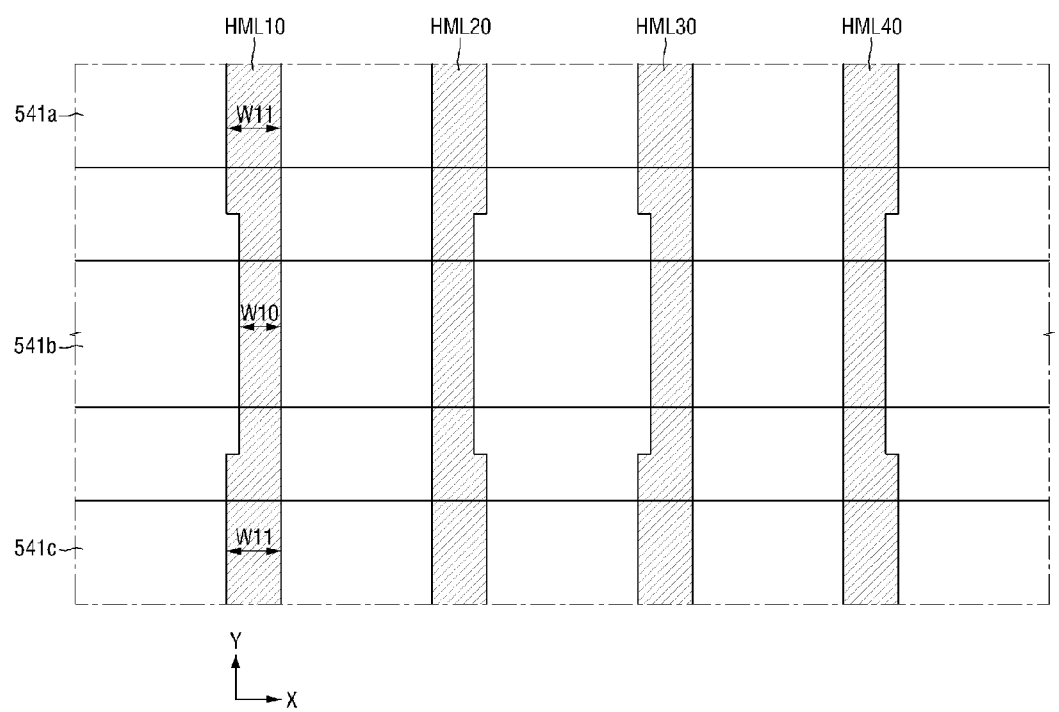
Figure 38B:
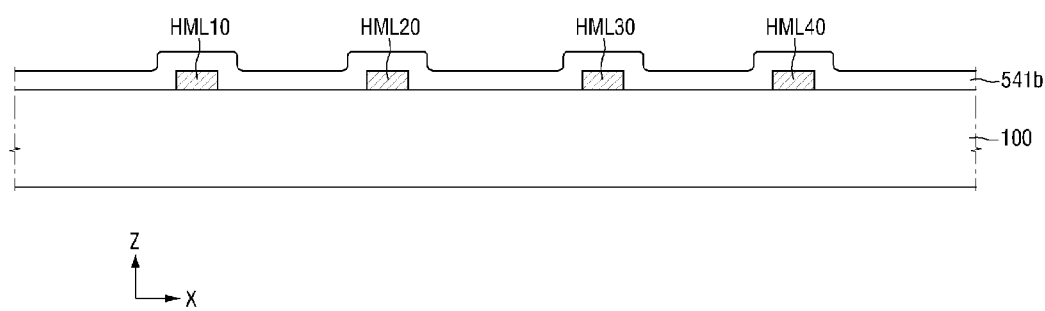

Subsequently, the layout shown in FIGS. 38A and 38B is realized. That is, the dummy structures 508, 510, 512, 514, and 516 and the dummy spacers 509a, 509b, 511a, 511b, 513a, 513b, 515a, 515b, 517a, and 517b are formed using the layout design.

First, the dummy structures 508, 510, 512, 514, and 516 extending in the first direction Y are formed on the active layer 100 using the above-described layout design.

Next, the dummy spacers 509a, 509b, 511a, 511b, 513a, 513b, 515a, 515b, 517a, and 517b extending in the first direction Y are formed at opposite sides of the dummy structures 508, 510, 512, 514, and 516.

Referring to FIGS. 37A to 37C, hard mask layers HML10, HML20, HML30 and HML40 are formed between the fourth dummy spacer 509b and the first dummy spacer 511a, between the first dummy spacer 511b and the second dummy spacer 513a, between the second dummy spacer 513b and the third dummy spacer 515a, and between the third dummy spacer 515b and the fifth dummy spacer 517b, respectively, by an etching process similar to that shown in and described with reference to FIGS. 24A to 24C.

Referring to FIGS. 38A and 38B, the dummy structures 508, 510, 512, 514, and 516 and the dummy spacers 509a, 509b, 511a, 511b, 513a, 513b, 515a, 515b, and 517a are removed, and second, third and fourth mask layers 541a, 541b and 541c are formed on the hard mask layers HML10, HML20, HML30 and HML40.

More specifically, active layer 100 may be exposed by removing the dummy structures 508, 510, 512, 514, and 516 and the dummy spacers 509a, 509b, 511a, 511b, 513a, 513b, 515a, 515b. In addition, a third mask layer 541b may be formed on first regions I of the hard mask layers HML10, HML20, HML30 and HML40, and second and fourth mask layers 541a and 541c may be formed on second regions II of the hard mask layers HML10, HML20, HML30 and HML40.

Subsequently, the hard mask layers HML10, HML20, HML30 and HML40 are etched using the second to fourth mask layers 541a, 541b and 541c as masks, thereby forming hard mask layers HML11, HML12, HML13, HML21, HML22, HML23, HML31, HML32, HML33, HML41, HML42, and HML43 shown in FIG. 39A.

Figure 39A:
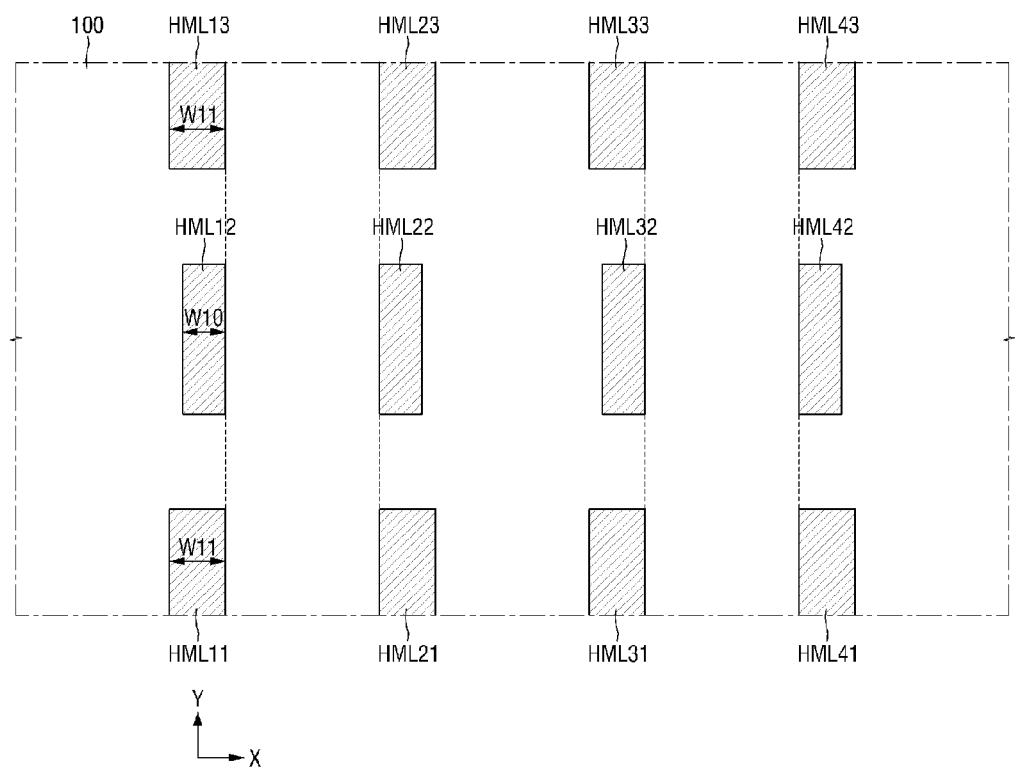
Figure 39B:
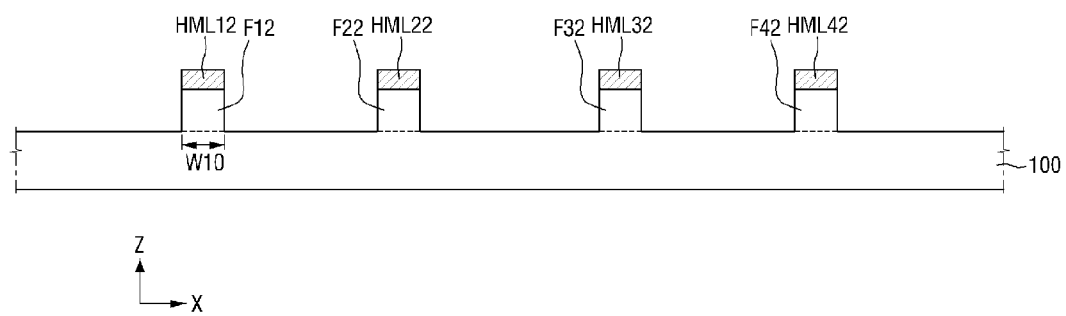

Referring to FIGS. 39A and 39B, the active layer 100 is etched to a predetermined depth using the hard mask layers HML11, HML12, HML13, HML21, HML22, HML23, HML31, HML32, HML33, HML41, HML42, and HML43 as masks. Therefore, active fins F11, F12, F13, F21, F22, F23, F31, F32, F33, F41, F42, and F43 are formed. Note, although FIGS. 35 to 39B illustrate processes of fabricating some portions of the semiconductor device 5 shown in FIG. 13 other similar portions of the device are formed in the same way.

Referring back to FIG. 13, after the active fins F11 to F43 (under the hard mask layers HML11 to HML43) are formed, a gate structure 192 and a spacer 115 extending the second direction X may be formed on the hard mask layers HML11 to HML43. FIG. 13 illustrates that the gate structure 192 and the spacer 115 may be formed in a state in which the hard mask layers HML11 to HML43 are not removed. Alternatively, the gate structure 192 and the spacer 115 may be formed on the active fins F11 to F43 after the hard mask layers HML11 to HML43 are removed.

In addition, a self-aligned contact 177 for electrically connecting the active fins F11 to F13, F21 to F23, F31 to F33 and F41 to F43 to each other may be formed between each of the active fins F11 to F13, F21 to F23, F31 to F33 and F41 to F43 spaced apart from each other in the first direction Y, but the present inventive concept is not limited thereto. That is, as mentioned above, the self-aligned contact 177 may be omitted, when necessary.

According to an aspect of the present inventive concept as described above, a width of a region of a dummy design may be varied by a marker generated by a correction module of a layout design system. Accordingly, a width of a hard mask layer (formed on an exposed portion of an active region) may be easily varied. This in turn allows the width of an active fin, formed by an etch process using the hard mask as an etch mask, to be easily controlled.

Thus, the layout design can generate designs of transistors, formed on an active fin, having various characteristics including various threshold voltages (Vth), leakage currents, and the like. The present inventive this also provides a method of fabricating a semiconductor device, which is capable of easily forming a transistor, on an active fin, having various characteristics such as various threshold voltages (Vth), leakage current, and the like.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:
1. A semiconductor device comprising:
an active fin extending longitudinally in a first direction, the active fin protruding upwardly from an active surface of an active layer, and the fin having an upper surface remote from said active surface of the active layer;
a hard mask layer disposed on the active fin, the hard mask layer being spaced from said active surface from which the fin protrudes so as to be out of contact with said active surface;
a gate structure extending longitudinally, in a second direction crossing the first direction, on the hard mask layer; and
a spacer disposed on at least one side of the gate structure, wherein the hard mask layer occupies a first region and a second region adjacent to the first region in the first direction, the second region extends under the gate structure, the hard mask layer has a bottom surface substantially matching the top surface of the active fin in the first and second regions, and a width, in the second direction, of the hard mask layer in the first region is less than a width, in the second direction, of the hard mask layer in the second region.

2. The semiconductor device of claim 1, wherein the second region also extends under the spacer.

3. A semiconductor device, comprising:
an active fin extending longitudinally in a first direction, the active fin protruding upwardly from an active surface of an active layer, and the fin having an upper surface remote from said active surface of the active layer;
a hard mask disposed on the active fin, the hard mask having a bottom surface substantially matching the top surface of the active fin so as to extend on the active fin in the first direction, and the hard mask being spaced from said active surface from which the fin protrudes so as to be out of contact with said active surface;
a gate structure extending longitudinally, in a second direction crossing the first direction, on the hard mask; and
a spacer disposed on at least one side of the gate structure, wherein the hard mask has a first segment and a second segment adjacent to the first segment in the first direction,
each of the first and second segments of the hard mask has a uniform width in the second direction, and the width of the first segment of the hard mask is different than the width of the second segment of the hard mask,
one portion of the second segment of the hard mask extends under the spacer, and
one portion of the first segment extends under the gate structure and another portion of the first segment extends under the spacer such that a boundary between the first and second segments of different widths exists under the spacer.

4. The semiconductor device of claim 2, wherein the hard mask layer comprises first, second and third hard masks spaced apart from each other in the second direction, and
in the second region, the distance in the second direction between the first and second hard masks is different from the distance in the second direction between the second and third hard masks.

5. The semiconductor device of claim 2, wherein the hard mask layer comprises first, second and third hard masks spaced apart from each other in the second direction, and
in the second region, the distance in the second direction between the first and second hard masks is the same as the distance in the second direction between the second and third hard masks.

6. The semiconductor device of claim 1, wherein the hard mask layer has first and second segments spaced apart from each other in the first direction, the first segment occupies the first region, and the second segment occupies the second region.

7. The semiconductor device of claim 1, wherein the hard mask layer comprises first, second and third hard masks spaced apart from each other in the second direction,
each of the first, second and third hard masks has first and second segments spaced apart from each other in the first direction, the first segment occupying the first region, and the second segment occupying the second region, and
the distance, in the second direction, between the second segment of the second hard mask and the second segment of the second hard mask is the same as that between the second segment of the second hard mask and the second segment of the third hard mask.

8. The semiconductor device of claim 1, wherein the hard mask layer comprises first, second and third hard masks spaced apart from each other in the second direction,
each of the first, second and third hard masks has first and second segments spaced apart from each other in the first direction, the first segment occupying the first region, and the second segment occupying the second region, and
the distance, in the second direction, between the second segment of the second hard mask and the second segment of the second hard mask is different than that between the second segment of the second hard mask and the second segment of the third hard mask.

9. The semiconductor device of claim 8, wherein one side of the first segment of each of the hard masks is aligned, in the first direction, with one side of the second segment of the hard mask.

10. The semiconductor device of claim 6, wherein the active fin has first and second segments spaced apart from each other in the first direction, the first segment of the active fin is disposed under the first region and the second segment of the active fin is disposed under the second region.

11. The semiconductor device of claim 10, further comprising a self-aligned contact electrically connecting the first and second segments of the active fin to each other.

12. A finFET structure comprising:
a plurality of active fins each extending longitudinally in a first direction, the active fins being spaced in a second direction perpendicular to the first direction, and each of the active fins having widths, as measured in the second direction, that differ in value from one another;
hard masks disposed on and aligned with upper surfaces of the fins, respectively; and
gate structures each extending longitudinally in the second direction,
wherein at least two of the gate structures extend over each of the hard masks, and each of the gate structures crosses at least one of the hard masks,
each of the hard masks has first and second segments whose respective widths, as measured in the second direction, differ in value from one another, and
one of the gate structures crosses over the first segment of at least one of the hard masks, and
another of the gate structures crosses over the second segment of at least one of the hard masks.

13. The finFET structure of claim 12, further comprising:
a spacer disposed on at least one side of each of the gate structures.

14. The finFET structure of claim 12, wherein each of the active fins is discontinuous in the first direction and has a first segment and a second segment spaced apart from the first segment in the first direction, the first segments of the active fins are aligned in the second direction, and the first segment of each of the active fins is narrower in the second direction than the second segment of the active fin.

15. The finFET structure of claim 14, wherein the distance between the first segments of one pair of adjacent ones of the active fins is different from the distance between the first segments of another pair of adjacent one of the active fins.

16. The finFET structure of claim 14, further comprising:
a spacer disposed on at least one side of each of the gate structures; and
self-aligned contacts each extending vertically between and electrically connecting the first and second segments of a respective one of the active fins.

* * * * *